US012761258B2

(12) United States Patent
Ito

(10) Patent No.: US 12,761,258 B2
(45) Date of Patent: Oct. 13, 2026

(54) SPECTRUM ANALYZER AND FREQUENCY MARKER POSITION SETTING METHOD OF THE SAME

(71) Applicant: ANRITSU CORPORATION, Kanagawa (JP)

(72) Inventor: Mitsutaka Ito, Kanagawa (JP)

(73) Assignee: ANRITSU CORPORATION, Kanagawa (JP)

( * ) Notice: Subject to any disclaimer, the term of this patent is extended or adjusted under 35 U.S.C. 154(b) by 169 days.

(21) Appl. No.: 18/779,919

(22) Filed: Jul. 22, 2024

(65) Prior Publication Data

US 2025/0044335 A1 Feb. 6, 2025

(30) Foreign Application Priority Data

Aug. 3, 2023 (JP) ................................ 2023-126780

(51) Int. Cl.
*G01R 29/08* (2006.01)
*G06F 3/0484* (2022.01)

(52) U.S. Cl.
CPC ........ *G01R 29/0892* (2013.01); *G06F 3/0484* (2013.01)

(58) Field of Classification Search
CPC .... G01R 29/0892; G01R 23/18; G01R 1/025; G06F 3/0484
See application file for complete search history.

(56) References Cited

U.S. PATENT DOCUMENTS

| | | | | |
|---|---|---|---|---|
| 6,289,207 | B1 * | 9/2001 | Hudecek | G06F 3/0227 455/150.1 |
| 2007/0229056 | A1 * | 10/2007 | Gorin | G01R 23/16 324/76.19 |
| 2008/0259082 | A1 * | 10/2008 | Engholm | G01R 13/0245 345/440 |
| 2009/0278830 | A1 * | 11/2009 | Onishi | G09G 5/003 345/211 |
| 2015/0004920 | A1 * | 1/2015 | Wakamatsu | H03J 1/04 455/77 |
| 2018/0236496 | A1 * | 8/2018 | Takasu | G01J 3/0264 |
| 2021/0325437 | A1 * | 10/2021 | Jones | G01R 23/18 |
| 2022/0107354 | A1 * | 4/2022 | Ikebe | H04M 1/24 |
| 2022/0244293 | A1 * | 8/2022 | Lapierre | G01R 13/0245 |

FOREIGN PATENT DOCUMENTS

JP 2011-080927 A 4/2011

* cited by examiner

*Primary Examiner* — Dominic E Hawkins
(74) *Attorney, Agent, or Firm* — McDonald Hopkins LLC

(57) ABSTRACT

A spectrum analyzer includes: a spectrum display control unit that displays a graph showing a spectrum characteristic, a frequency marker, and a level marker on a spectrum display screen; an input-enabled state display control unit that displays a frequency indication frame in an input-enabled state, in response to an operation of selecting the frequency marker via a keyboard; and a marker position setting display control unit that receives input of a desired frequency to the frequency indication frame in a case of the input-enabled state, changes a position of the frequency marker on a horizontal axis (frequency axis) to a position of the input frequency, and updates a value of a frequency indicated by the frequency indication frame to a value of the input frequency to display the updated value.

8 Claims, 12 Drawing Sheets

SPECTRUM ANALYZER AND FREQUENCY MARKER POSITION SETTING METHOD OF THE SAME

TECHNICAL FIELD

The present invention relates to a spectrum analyzer that analyzes a measured signal and displays a waveform of a spectrum characteristic together with a frequency marker based on an analysis result thereof, and a frequency marker position setting method of the same.

BACKGROUND ART

As is well known, a spectrum analyzer extracts a frequency component in a frequency band set in advance from a measured signal (input signal) and analyzes a spectrum characteristic, and displays a waveform of the spectrum characteristic on a display unit based on an analysis result thereof.

With regard to display control of the spectrum characteristic in the spectrum analyzer, for example, a method of displaying a waveform (graph) representing a frequency-versus-signal-level relationship of a measured signal on a two-dimensional plane having scales of a frequency on a horizontal axis and a signal intensity (hereinafter, a signal level) on a vertical axis is known (for example, Patent Document 1). A user can understand, while focusing on a desired band (zone) from the displayed graph (refer to FIG. 8), a signal level of a frequency in the zone.

RELATED ART DOCUMENT

Patent Document

[Patent Document 1] JP-A-2011-80927

DISCLOSURE OF THE INVENTION

Problem that the Invention is to Solve

In the spectrum analyzer that displays the spectrum characteristic in a graph, the work of checking the frequency-versus-signal-level relationship in a desired zone in detail may be repeatedly performed while switching the focused zone on the graph.

FIG. 12 shows a display example of the spectrum characteristic in the spectrum analyzer according to the related art of this type. A check procedure of the spectrum characteristic in the spectrum analyzer according to the related art will be described with reference to FIG. 12.

In the spectrum analyzer according to the related art, for example, a spectrum display screen 70 as shown in FIG. 12 is displayed based on an analysis result of the spectrum characteristic of the measured signal, and a graph 80 of the spectrum characteristic is displayed in a graph display region 71. The spectrum display screen 70 also displays a setting status display region 72 that displays a setting status of a center frequency, a frequency span, and the like related to the analysis of the spectrum characteristic, and a function menu region 73 that displays a function menu related to various settings and the like.

During the display on the spectrum display screen 70, the user can set, for example, dotted regions indicated by reference numerals 81 and 82 as zone markers in association with the graph 80 such that the user can check the frequency-versus-signal-level relationship by narrowing down the zone. A position of the zone marker, a zone width, and the like can be changed, and processing related to the change is performed, for example, by the following procedure.

Here, a case where Marker1 is set (changed) to a zone center frequency=5.9875 GHZ and the zone width (Zone Width)=1 MHz will be described. It should be noted that, in the following description, physical keys (including an F1 key (GHz) and an F2 key (MHz)) are keys on a keyboard, for example. In addition, the Marker main function menu displayed in the function menu region 73 of FIG. 12 is composed of two pages, and the page displayed in FIG. 12 is a first page.

In this case, the user presses a Marker key (physical key). Next, the F1 key (Active Marker) of the function menu region 73 is pressed, and then the F1 key (Marker1) is further pressed to set the active marker to 1. Next, a second page (not shown) of the Marker main function menu is displayed, an item of the zone center frequency is selected, 5.9875 is pressed with a physical key (number key), and then the F1 key (GHz) is pressed. As a result, the zone center frequency “5.9875 GHz” is set.

Next, the first page (refer to FIG. 12) of the Marker main function menu is displayed, and F6 (Zone Width) is pressed. Further, in a case where the F2 key (MHz) is pressed after the “1” is pressed by the physical key, the zone width “1 MHz” is set.

As described above, in the spectrum analyzer according to the related art, in order to set (or change) the position of the zone marker (horizontal axis marker), for example, in the function menu region 73 of the spectrum display screen 70, it is necessary to perform a complicated operation such as opening a plurality of function menus (other screens) required for the operation of setting and changing in a multi-stage manner, and opening each menu to input a setting value for each item. In some items, for example, an operation of a physical encoder is required to input a setting value.

As described above, in the spectrum analyzer according to the related art, in a case of setting a position of a horizontal axis marker (frequency marker) such as the zone marker, for example, a procedure of opening several other screens on the spectrum display screen 70 as necessary is required, and an operation of a physical encoder is required, and thus a workload of a user related to the setting of the position of the frequency marker is extremely large.

The present invention has been made to solve such a problem in the related art, and an object of the present invention is to provide a spectrum analyzer and a frequency marker position setting method of the same with which a frequency marker position can be efficiently set with a small amount of work without requiring work such as opening another screen and operating a physical encoder during display of a spectrum display screen.

In order to solve the above problem, a spectrum analyzer according to Claim 1 of the present invention includes: spectrum display control means (31) for displaying a spectrum display screen (50) including a graph region (52) defined by a horizontal axis having a scale of a frequency and a vertical axis having a scale of a signal level, and for displaying, on the graph region, a graph (60) showing a spectrum characteristic of a measured signal analyzed by signal analysis means (15), a frequency marker (61) including a frequency indication frame (61*a*) indicating a value of a frequency on the horizontal axis corresponding to a point on the graph, and a level marker (62) including a level indication frame (62*a*) indicating a value of a signal level on the vertical axis corresponding to the point; input-enabled state display control means (32) for displaying the frequency indication frame in a mode indicating an input-enabled state in which a desired frequency is inputtable, in response to an operation of selecting the frequency marker via input means (20*a*), during the display of the spectrum display screen; operation-enabled state display control means (32A) for displaying the graph region in a mode indicating an operation-enabled state in which a movement operation of the frequency marker along the horizontal axis is receivable, in response to an operation of selecting the graph via the input means (20*a*), during the display of the spectrum display screen; and frequency marker position setting display control means (34, 34A) for receiving the input of the desired frequency to the frequency indication frame via the input means in a case of the input-enabled state, for changing a position of the frequency marker on the horizontal axis to a position of the input frequency, for updating the value of the frequency indicated by the frequency indication frame to a value of the input frequency to display the updated value, for receiving the movement operation of the frequency marker via the input means in a case of the operation-enabled state, for changing the position of the frequency marker to a position of a frequency corresponding to the movement operation, and for updating the value of the frequency indicated by the frequency indication frame to a value of the frequency at the position after the change to display the updated value.

With this configuration, in the spectrum analyzer according to Claim 1 of the present invention, via a simple operation of inputting the desired frequency within the frequency indication frame of the frequency marker, during the display of the spectrum display screen, using the frequency marker displayed on the spectrum display screen in association with the graph and indicating the position of the frequency corresponding to the point on the graph as a tool for inputting a value of a frequency for which the change is requested, it is possible to easily change the position of the frequency marker to the position of the desired frequency. In addition, via a simple operation of moving the position of the frequency marker to the position of the desired frequency, during the display of the spectrum display screen, using the frequency marker displayed on the spectrum display screen in association with the graph and indicating the position of the frequency corresponding to the point on the graph as a tool capable of being moved to the position of the frequency for which the change is requested, it is possible to easily change the position of the frequency marker to the position of the desired frequency. As a result, in a case of setting the position of the frequency marker, it is not necessary to perform any complicated work such as opening another screen and operating a physical encoder, and it is possible to significantly reduce the workload related to the position setting of the frequency marker.

In addition, in the spectrum analyzer according to Claim 2 of the present invention, the frequency marker position setting display control means changes a position of the level marker on the vertical axis to a position of a signal level corresponding to the updated frequency in accordance with the change of the position of the frequency marker, and updates the value of the signal level indicated by the level indication frame to a value corresponding to the changed position of the signal level to display the updated value.

With this configuration, in the spectrum analyzer according to Claim 2 of the present invention, in a case of setting the position of the frequency marker, the position of the level marker corresponding to the position of the frequency marker after the setting can also be set simultaneously and easily, and load of check work in a case where it is necessary to repeatedly check a frequency-versus-signal-level relationship for any desired frequency can be reduced.

In addition, in the spectrum analyzer according to Claim 3 of the present invention, the frequency marker position setting display control means further displays, on the graph region, a frequency indication line (61*b*) extending parallel to the vertical axis from a position of the frequency indicated by the frequency indication frame and a level indication line (62*b*) extending along the horizontal axis from a position of the signal level indicated by the level indication frame.

With this configuration, in the spectrum analyzer according to Claim 3 of the present invention, even after the positions of the frequency marker and the level marker are set, waveforms in the vicinity of an intersection of both of the frequency indication line and the level indication line can be easily checked with reference to the frequency indication line and the level indication line on the graph of the spectrum characteristic.

In addition, in the spectrum analyzer according to Claim 4 of the present invention, the signal analysis means analyzes the spectrum characteristics of a plurality of radio frequency signals having different frequency ranges in a millimeter wave band as the measured signal, and the spectrum display control means displays the graph showing the spectrum characteristic of one radio frequency signal that is selected from among the plurality of radio frequency signals.

With this configuration, in the spectrum analyzer according to Claim 4 of the present invention, for any of the plurality of radio frequency signals in each frequency range of the millimeter wave band, one radio frequency signal can be selected from among the plurality of radio frequency signals, and the positions of the frequency marker and the level marker can be set by a simple operation without requiring an operation such as opening another screen.

In addition, in order to solve the above problem, a frequency marker position setting method of a spectrum analyzer according to Claim 5 of the present invention is a frequency marker position setting method of a spectrum analyzer including spectrum display control means (31) for displaying a spectrum display screen (50) including a graph region (52) defined by a horizontal axis having a scale of a frequency and a vertical axis having a scale of a signal level, and for displaying, on the graph region, a graph (60) showing a spectrum characteristic of a measured signal analyzed by signal analysis means (15), a frequency marker (61) including a frequency indication frame (61*a*) indicating a value of a frequency on the horizontal axis corresponding to a point on the graph, and a level marker (62) including a level indication frame (62*a*) indicating a value of a signal level on the vertical axis corresponding to the point, and the frequency marker position setting method includes: an input-enabled state display control step (S12) of displaying the frequency indication frame in a mode indicating an input-enabled state in which a desired frequency is inputtable, in response to an operation of selecting the frequency marker via input means (20*a*), during the display of the spectrum display screen; an input reception step (S13) of receiving the input of the desired frequency to the frequency indication frame via the input means in a case of the input-enabled state; and a frequency marker position setting display control step (S14) of changing a position of the frequency marker on the horizontal axis to a position of the input frequency, and of updating the value of the frequency indicated by the frequency indication frame to a value of the input frequency to display the updated value.

With this configuration, in the frequency marker position setting method of the spectrum analyzer according to Claim 5 of the present invention, via a simple operation of inputting the desired frequency within the frequency indication frame of the frequency marker, during the display of the spectrum display screen, using the frequency marker displayed on the spectrum display screen in association with the graph and indicating the position of the frequency corresponding to the point on the graph as a tool for inputting a value of a frequency for which the change is requested (step S13), it is possible to easily change the position of the frequency marker to the position of the desired frequency (step S14). As a result, in a case of setting the position of the frequency marker, it is not necessary to perform any complicated work such as opening another screen and operating a physical encoder, and it is possible to significantly reduce the workload related to the position setting of the frequency marker.

In addition, in order to solve the above problem, a frequency marker position setting method of a spectrum analyzer according to Claim 6 of the present invention is a frequency marker position setting method of a spectrum analyzer including spectrum display control means (31) for displaying a spectrum display screen (50A) including a graph region (52) defined by a horizontal axis having a scale of a frequency and a vertical axis having a scale of a signal level, and for displaying, on the graph region, a graph (60) showing a spectrum characteristic of a measured signal analyzed by signal analysis means (15), a frequency marker (61) including a frequency indication frame (61*a*) indicating a value of a frequency on the horizontal axis corresponding to a point on the graph, and a level marker (62) including a level indication frame (62*a*) indicating a value of a signal level on the vertical axis corresponding to the point, and the frequency marker position setting method includes: an operation-enabled state display control step (S12A) of displaying the graph region in a mode indicating an operation-enabled state in which a movement operation of the frequency marker along the horizontal axis is receivable, in response to an operation of selecting the graph via input means (20*a*), during the display of the spectrum display screen; an operation reception step (S13A) of receiving the movement operation of the frequency marker via the input means in a case of the operation-enabled state; and a frequency marker position setting display control step (S14A) of changing a position of the frequency marker to a position of a frequency corresponding to the movement operation, and of updating the value of the frequency indicated by the frequency indication frame to a value of the frequency at the position after the change to display the updated value.

In addition, in order to solve the above problem, the frequency marker position setting method of a spectrum analyzer according to Claim 7 of the present invention further includes: a step (S15) of changing a position of the level marker on the vertical axis to a position of a signal level corresponding to the updated frequency in accordance with the change of the position of the frequency marker, and updating the value of the signal level indicated by the level indication frame to a value corresponding to the changed position of the signal level to display the updated value.

In addition, in order to solve the above problem, the frequency marker position setting method of a spectrum analyzer according to Claim 8 of the present invention further includes: a step (S15A) of changing a position of the level marker on the vertical axis to a position of a signal level corresponding to the updated frequency in accordance with the change of the position of the frequency marker, and updating the value of the signal level indicated by the level indication frame to a value corresponding to the changed position of the signal level to display the updated value.

With this configuration, in the frequency marker position setting method of the spectrum analyzer according to Claim 6 of the present invention, via a simple operation of moving the position of the frequency marker to the position of the desired frequency, during the display O spectrum display screen, using the frequency marker displayed on the spectrum display screen in association with the graph and indicating the position of the frequency corresponding to the point on the graph as a tool capable of being moved to the position of the frequency for which the change is requested (S13A), it is possible to easily change the position of the frequency marker to the position of the desired frequency (S14A). As a result, in a case of setting the position of the frequency marker, it is not necessary to perform any complicated work such as opening another screen and operating a physical encoder, and it is possible to significantly reduce the workload related to the position setting of the frequency marker.

Advantage of the Invention

According to the present invention, it is possible to provide a spectrum analyzer and a frequency marker position setting method of the same with which a frequency marker position can be efficiently set with a small amount of work without requiring work such as opening another screen and operating a physical encoder during display of a spectrum display screen.

BRIEF DESCRIPTION OF THE DRAWINGS

FIG. 3A shows a display example of an initial screen of the spectrum display screen, and FIG. 3B shows a display example after position setting via marker position setting display control.

BEST MODE FOR CARRYING OUT THE INVENTION

Figure 1:
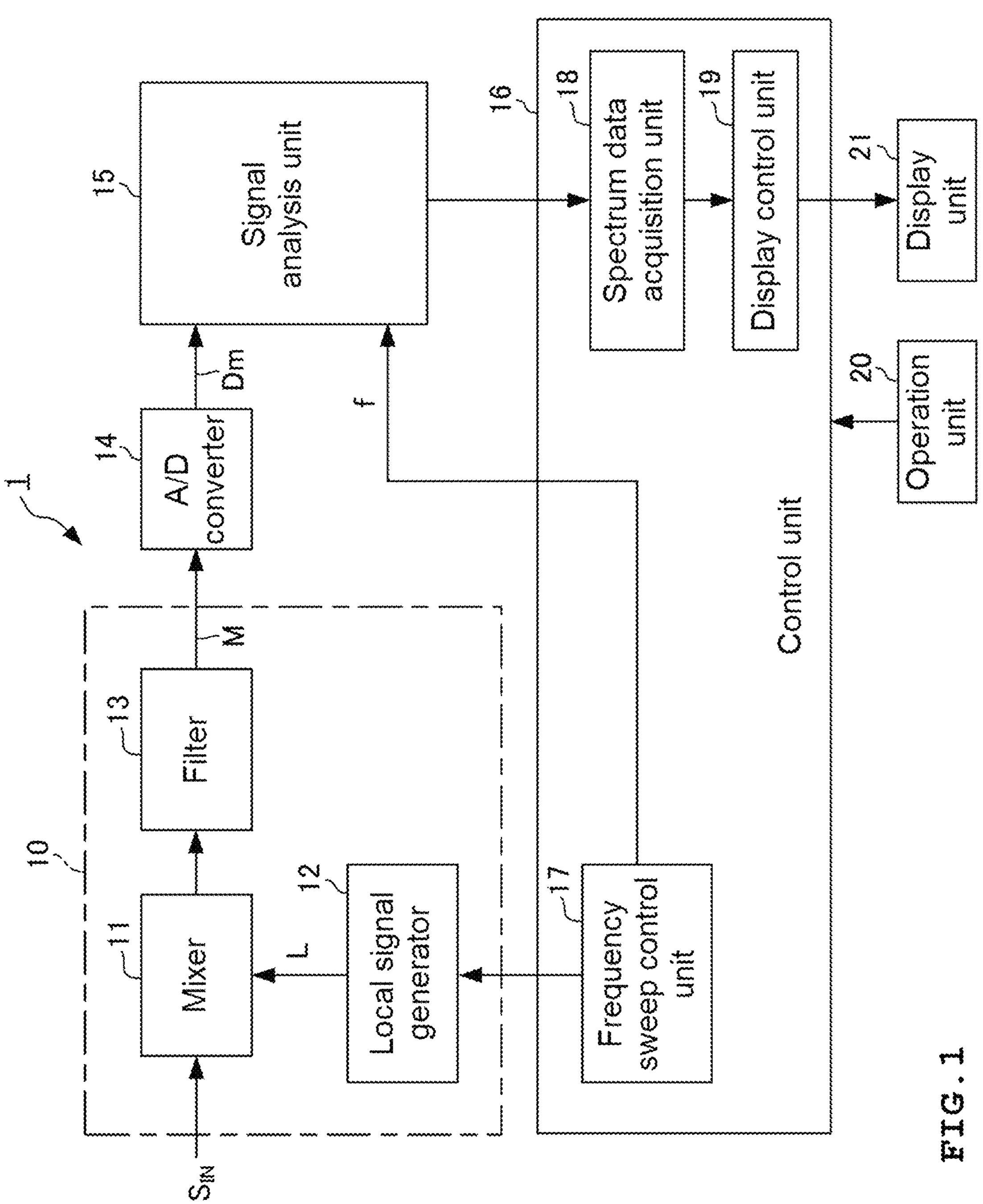
FIG. 1 is a block diagram showing a configuration of a spectrum analyzer according to an embodiment of the present invention.

Hereinafter, a spectrum analyzer and a frequency marker position setting method of the same according to an embodiment of the present invention will be described.

The spectrum analyzer according to the embodiment of the present invention can be applied to, for example, measurement of a function of a communication terminal that enables high-speed communication in a millimeter wave (200 GHz to 300 GHz or the like) band, in consideration of the promotion of the development of 5G or more advanced communication technologies.

The spectrum analyzer according to the embodiment of the present invention has, in addition to a display control function of analyzing a spectrum characteristic of a measured signal and of displaying a graph showing the spectrum characteristic based on an analysis result thereof, a marker position setting display control function of changing a position of a frequency marker displayed in association with the graph to a position of a frequency designated by a user and of updating a frequency indication value at the position to a value of a frequency at the position after the change to display the updated frequency indication value. The marker position setting display control function also has a display control function of changing a position of a level marker to a position of a signal level corresponding to the position of the frequency marker after the change, and of updating a signal level indication value at the position to a value of a signal level corresponding to a frequency indicated by the frequency marker after the change to display the updated signal level indication value.

In order to implement the marker position setting display control function, the spectrum analyzer according to the embodiment of the present invention has a configuration in which the frequency marker displayed in association with the graph on a spectrum display screen and indicating a position of a frequency on a horizontal axis corresponding to a point on the graph is used as a tool for inputting a value of a frequency for which a change is requested (displayed as operable as the tool) and an operation of inputting a desired frequency into a frequency indication frame of the frequency marker is received during display of the spectrum display screen to change the position of the frequency marker to a position of the desired frequency.

With this configuration, in the spectrum analyzer according to the present embodiment, the position of the frequency marker can be easily changed to the position of the desired frequency by a simple operation of inputting the desired frequency into the frequency indication frame of the frequency marker during the display of the spectrum display screen. As a result, it will contribute to the future development and promotion of a high-speed and high-performance spectrum analyzer.

First, a configuration of the spectrum analyzer according to the embodiment of the present invention will be described with reference to FIGS. 1 to 3B.

As shown in FIG. 1, a spectrum analyzer 1 according to the embodiment of the present invention includes a frequency conversion unit 10, an analog/digital (A/D) converter 14, a signal analysis unit 15, a control unit 16, an operation unit 20, and a display unit 21.

The frequency conversion unit 10 includes a mixer 11, a local signal generator 12, and a filter 13.

The mixer 11 is a functional unit as frequency conversion means that mixes (performs mixing) an input signal (RF frequency) $S_{IN}$ of each frequency component input through the reception processing via the preceding stage configuration unit and a local signal L input from the local signal generator 12 to convert the input signal $S_{IN}$ from a signal at the RF frequency into a signal at an intermediate frequency (IF frequency), and outputs the input signal $S_{IN}$ to the filter 13.

The local signal generator 12 generates the local signal L to be transmitted to the mixer 11 for mixing the local signal L with the input signal $S_{IN}$ described above. The local signal generator 12 has, for example, a phase-locked loop (PLL) circuit, and is configured to be capable of outputting the local signal L having a frequency corresponding to data given from an outside, and the frequency of the local signal L is swept by sequentially updating frequency data input from a frequency sweep control unit 17.

The filter 13 is a filter functional unit that inputs the IF signal frequency-converted by the mixer 11, passes only a signal M of a frequency component in a band, which is set in advance, of the input IF signal, and inputs the signal M to the A/D converter 14.

The A/D converter 14 is a functional unit that samples the analog signal M (an output signal of the frequency conversion unit 10) input from the filter 13 and converts the analog signal M into a digital signal sequence (digital signal Dm).

The signal analysis unit 15 is a functional unit that inputs the digital signal Dm output by the A/D converter 14, performs processing of analyzing the intensity (level) of the signal (IF) in each band, and outputs an analysis result thereof, that is, analysis result data indicating the correspondence relationship (spectrum characteristic) between the frequency and the signal level, to the control unit 16. The signal analysis unit 15 constitutes signal analysis means according to the embodiment of the present invention.

The control unit 16 is a functional unit that integrally controls the entire spectrum analyzer 1, and includes a frequency sweep control unit 17, a spectrum data acquisition unit 18, and a display control unit 19. The control unit 16 may be a control unit of a main body of the spectrum analyzer 1, or may have a configuration in which a device such as a personal computer (PC) is separately provided. In any configuration, the control unit 16 is configured by a microcomputer including a CPU (central processing unit), ROM, RAM, a peripheral device such as an input/output port, and is caused to function as each functional unit such as the frequency sweep control unit 17, the spectrum data acquisition unit 18, and the display control unit 19, for example, by executing a control program stored in advance in the ROM.

The frequency sweep control unit 17 is a functional unit that executes frequency sweep control of changing the frequency of the local signal L output by the local signal generator 12 to the mixer 11 within, for example, a frequency range designated by the user from the operation unit 20.

The spectrum data acquisition unit 18 performs processing of acquiring analysis result data (data indicating a correspondence relationship (spectrum characteristic) between the frequency and the signal level), which is obtained by analysis processing performed by the signal analysis unit 15 in accordance with the frequency sweep control of the frequency sweep control unit 17, from the signal analysis unit 15.

The display control unit 19 is a portion that performs display control of displaying a graph 60 (refer to FIGS. 3A and 3B) showing the spectrum characteristic on the display unit 21 based on the analysis result data acquired by the spectrum data acquisition unit 18, and of changing (transitioning) the positions of a frequency marker 61 and a level marker 62 displayed in association with the graph 60 to a positions designated by the user to display the changed positions.

The operation unit 20 has input means such as various keys, switches, buttons, or a mouse or a keyboard 20*a*, and is operated by the user in a case of performing various settings related to the measurement of the measured signal or the like. The keyboard 20*a* constitutes input means according to the embodiment of the present invention.

The display unit 21 is configured by, for example, a liquid crystal displayer or the like, and is a functional unit that displays a setting screen or a measurement result (spectrum display screen 50: refer to FIGS. 3A and 3B) related to the measurement of the measured signal.

In the spectrum analyzer 1 having the above-described configuration, the display control unit 19 has a spectrum display control function (refer to FIG. 3A) of displaying the graph 60 showing the spectrum characteristic including the frequency marker 61 and the level marker 62 using the spectrum display screen 50.

In addition, the display control unit 19 has a marker position setting display control function (refer to FIG. 3B) of changing a position of a frequency marker 61 indicating a frequency on a horizontal axis corresponding to a point of the graph 60 (for example, indicating a center frequency of the graph 60 in an initial screen immediately after the display (refer to FIG. 3A)) to a position designated by the user, displaying a value of a frequency corresponding to the position after the change in a frequency indication frame 61*a*, changing a position of a level marker 62 in accordance with the change of the position of the frequency marker 61, and displaying a value of a signal level corresponding to the position of the frequency after the change in a level indication frame 62*a*.

Figure 2:
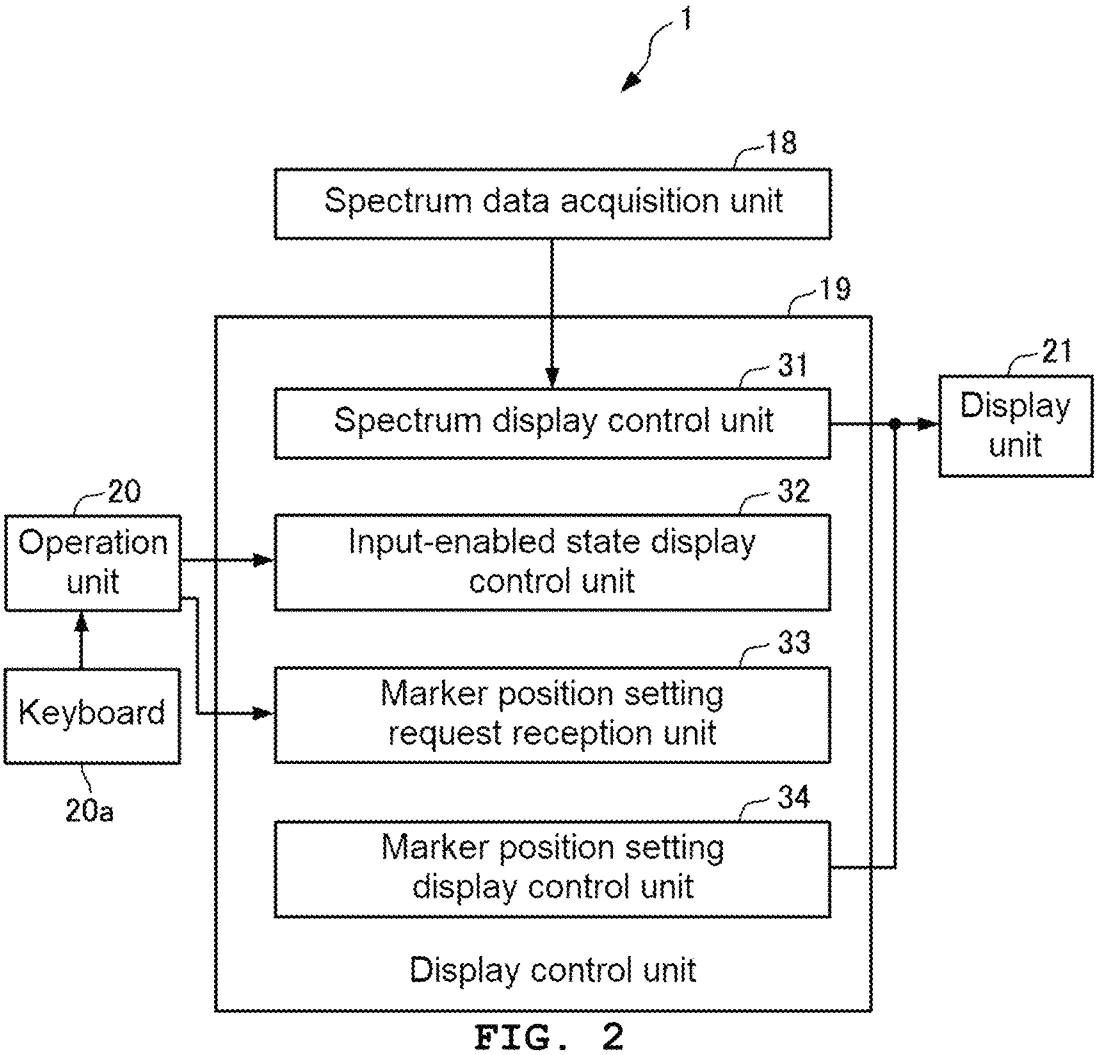
FIG. 2 is a block diagram showing a functional configuration of a display control unit in the spectrum analyzer according to the embodiment of the present invention.

In order to implement the above-described spectrum display control function and the marker position setting display control function, the display control unit 19 is configured to include functional blocks shown in FIG. 2.

As shown in FIG. 2, in the spectrum analyzer 1 according to the present embodiment, the display control unit 19 includes a spectrum display control unit 31, an input-enabled state display control unit 32, a marker position setting request reception unit 33, and a marker position setting display control unit 34.

The spectrum display control unit 31 corresponds to spectrum display control means according to the embodiment of the present invention, and performs control of displaying the spectrum characteristic on the display unit 21. Display examples of the spectrum characteristic in the spectrum analyzer 1 according to the present embodiment are shown with schematic diagrams in FIGS. 3A and 3B.

Figure 3A:
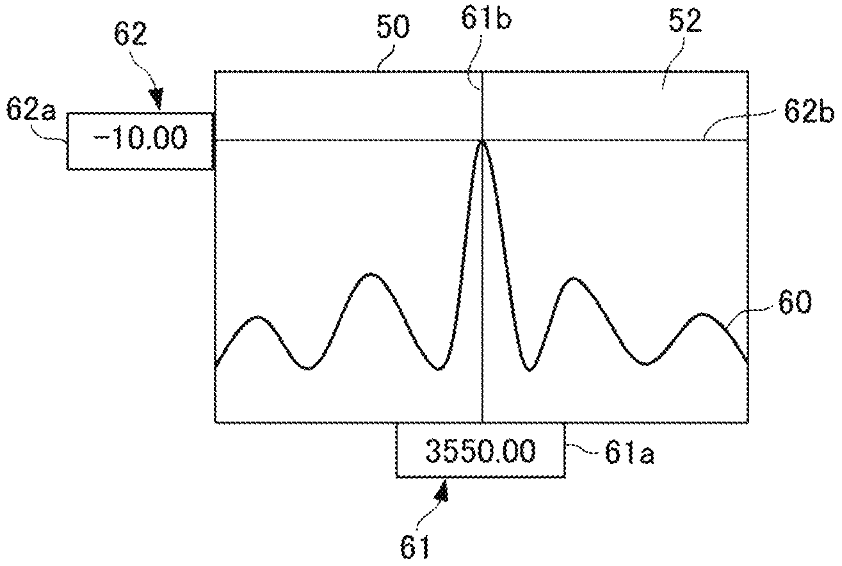
FIGS. 3A and 3B are transition diagrams of a spectrum display screen via display control of the display control unit of the spectrum analyzer according to the embodiment of the present invention.
Figure 3B:
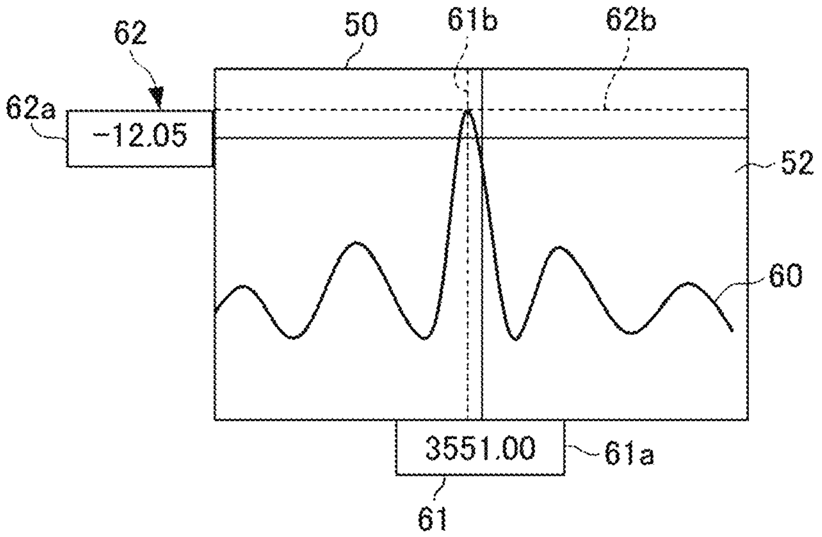

As shown in FIGS. 3A and 3B, the spectrum display control unit 31 displays the spectrum characteristic with the graph 60 using the spectrum display screen 50.

A frequency marker 61 and the level marker 62 are added to the graph 60. The frequency marker 61 is a tool that indicates a value of a frequency (a frequency corresponding to the position of the frequency marker 61 on the horizontal axis) at a point on the graph 60 within the frequency indication frame 61*a*.

The level marker 62 is a tool that indicates a value of a signal level at a point on the graph 60 described above (a signal level corresponding to a position of the level marker 62 on a vertical axis: corresponding to the frequency indicated by the frequency marker 61) within the level indication frame 62*a*. In the example of FIG. 3A showing the initial screen of the spectrum display screen 50, the frequency marker 61 indicates the frequency value (position) of 3550.00 MHz, which is the center frequency of the graph 60, and the level marker 62 indicates the signal level of −10.00 dBm corresponding to the center frequency described above.

In addition, from the frequency indication frame 61*a* of the frequency marker 61, a frequency indication line 61*b* that continuously indicates the value of the frequency indicated by the frequency indication frame 61*a* along a direction parallel to the vertical axis is also displayed. On the other hand, from the level indication frame 62*a* of the level marker 62, the level indication line 62*b* that continuously indicates the value of the signal level indicated by the level indication frame 62*a* along a direction parallel to the horizontal axis is also displayed. As a result, the user can easily understand a correspondence relationship (frequency versus signal level) between the frequency value indicated by the frequency marker 61 in the frequency indication frame 61*a* and the level value of the signal indicated by the level marker 62 in the level indication frame 62*a*, at an intersection (a point on the graph described above) of the frequency indication line 61*b* and the level indication line 62*b*.

In addition, in the configuration of the display control unit 19 shown in FIG. 2, the input-enabled state display control unit 32 performs control of displaying the frequency indication frame 61*a* in a mode indicating an input-enabled state in which a desired frequency is inputtable in response to selection of the frequency marker 61 during the display of the spectrum display screen 50.

Specifically, the input-enabled state display control unit 32 displays the frequency indication frame 61*a* in a mode in which a cursor 610 (refer to FIG. 7) indicating an input position for inputting a value of the frequency for which the change is requested is added, for example, in a case where the frequency marker 61 is selected by a predetermined operation of the user on the operation unit 20. After that, the frequency marker 61 is controlled to function as an input tool that designates the frequency of the frequency marker 61 for which the change is requested, with reference to the position of the cursor 610 within the frequency indication frame 61*a*. The input-enabled state display control unit 32 constitutes input-enabled state display control means according to the embodiment of the present invention.

The marker position setting request reception unit 33 is a functional unit that performs processing of receiving the input of the position (the value of the frequency) for requesting the change of the frequency marker 61 from the position of the cursor 610 within the frequency indication frame 61*a* of the frequency marker 61. The input of the position for requesting the change (and the selection of the frequency marker 61 described above) can be performed using, for example, the keyboard 20*a*, which is one of the devices configuring the operation unit 20.

The marker position setting display control unit 34 performs display control of changing the position of the frequency marker 61 to the position of the input frequency and of changing the position of the level marker 62 to the position of the signal level corresponding to the position of the frequency marker 61 after the change by receiving the input of the frequency changing into the frequency indication frame 61*a* of the frequency marker 61. Here, the marker position setting display control unit 34 updates the frequency indication value within the frequency indication frame 61*a* of the frequency marker 61 at the transitioned position to a value of a frequency corresponding to the position.

In addition, for the level marker 62, the marker position setting display control unit 34 updates the level indication value in the level indication frame 62*a* to a value of the signal level corresponding to the updated frequency value in the frequency indication frame 61*a* of the frequency marker 61. The marker position setting display control unit 34 constitutes marker position setting display control means according to the embodiment of the present invention.

A specific example of the marker position setting display control performed by the input-enabled state display control unit 32, the marker position setting request reception unit 33, and the marker position setting display control unit 34 described above will be described with reference to FIGS. 3A and 3B.

In the spectrum display screen 50 shown in FIGS. 3A and 3B, the frequency marker 61 functions as an input tool for another desired value in a case of changing the value of the frequency indicated at the position to the desired value. FIG. 3B shows an input example for the frequency indication frame 61*a* in a case of requesting to change and set the value of the frequency (center frequency) of 3550.00 MHz indicated by the frequency indication frame 61*a* in FIG. 3A to a position of 3551.00 MHZ.

The marker position setting display control unit 34 receives the input (designation) of the frequency for which the change setting with respect to the frequency marker 61 is requested, and then further receives the operation of starting the setting, whereby the marker position setting display control unit 34 changes the position of the frequency marker 61 to the designated position of the frequency of 3551.00 MHz as shown in FIG. 3B, and updates the display of the frequency marker 61 within the frequency indication frame 61*a* from the value of the frequency of 3550.00 MHz until that point to the value of frequency of 3551.00 MHz corresponding to the position after the change. In addition, the marker position setting display control unit 34 performs processing of updating the value of the level of −10.00 dBm of the level marker 62 corresponding to the value of the frequency of 3551.00 MHz after the update to the level of −12.05 dBm corresponding to the value of the frequency of 3551.00 MHz and of displaying the updated value within the level indication frame 62*a*.

The marker position setting display control in a mode shown in FIG. 3B may be performed a plurality of times in order to check the frequency-versus-signal-level relationship at the desired frequency band of the spectrum characteristic (graph 60) in the spectrum display screen 50 being displayed, one by one. As described above, the marker position setting display control in this case is executed by the marker position setting display control unit 34 in conjunction with the input-enabled state display control unit 32 and the marker position setting request reception unit 33 in the configuration of the display control unit 19 shown in FIG. 2.

Next, a spectrum measurement operation of the spectrum analyzer 1 according to the present embodiment will be described with reference to a flowchart shown in FIG. 4. Here, for example, the spectrum analyzer 1 inputs a signal in the millimeter wave band, extract a signal (measured signal) in the frequency band (analysis target frequency band) set in advance by the user in the input signal $S_{IN}$, perform A/D conversion, and then input the signal to the signal analysis unit 15, and measure the spectrum characteristic of the signal.

In order to perform the spectrum measurement, the user performs, for example, an operation of setting a sweep frequency range (analysis target frequency range) of the spectrum analyzer 1 in the operation unit 20 (step S1). Examples of a parameter to be set by this operation include a maximum value of the signal level to be input, a center frequency, a frequency width (span frequency), and the number of acquired samples. Here, a start frequency and a stop frequency may be set instead of the center frequency and the span frequency. In this case, the frequency sweep control unit 17 can calculate the center frequency by an operation of (start frequency+stop frequency)/2 and can calculate the span frequency by an operation of (stop frequency−start frequency).

In a case where the setting operation in step S1 is completed and then, for example, the operation of starting the measurement is performed by the operation unit 20, the control unit 16 extracts the signal within the sweep frequency range set in step S1 from the input signal $S_{IN}$ in the millimeter wave band input to the mixer 11, analyze the spectrum characteristic of the signal to drive and control the respective units of a device for displaying the analysis result thereof.

First, in the control unit 16, the frequency sweep control unit 17 drives and controls the local signal generator 12 in n accordance with the setting of each parameter (the center frequency and the span frequency, or the start frequency and the stop frequency, or the like) in step S1 described above, and performs the frequency sweep control of sweeping the frequency of the local signal L input to the mixer 11 from the local signal generator 12 in a predetermined step (step S2). In this case, the frequency sweep control unit 17 sends information (frequency information) f of each frequency related to the sweep control to the signal analysis unit 15.

The control unit 16 performs frequency conversion processing of driving and controlling the frequency conversion unit 10 and of mixing the frequency-swept local signal L and the input signal $S_{IN}$ with the mixer 11 to convert the mixed signal into an intermediate frequency (IF) signal, in accordance with the sweep control of the local signal L in step S2 (step S3).

Further, the control unit 16 drives and controls the frequency conversion unit 10 to filter the mixed signal converted into the intermediate frequency (IF) with the filter 13 to extract the signal M in a predetermined intermediate frequency (IF) band from the mixed signal, that is, the frequency component of the analysis target (step S4), and to transmit the signal M to the A/D converter 14.

Next, the A/D converter 14 converts the signal M, which is the analysis target input from the frequency conversion unit 10, from the analog signal into the digital signal Dm (step S5), and inputs the digital signal Dm to the signal analysis unit 15.

The signal analysis unit 15 performs processing of analyzing the spectrum characteristic of the digital signal Dm based on the digital signal Dm input from the A/D converter 14 and the frequency information f sent from the frequency sweep control unit 17 in accordance with the frequency sweep control (refer to step S2) described above (step S6). Here, the signal analysis unit 15 performs processing of targeting the digital signal Dm, of analyzing the frequency and the signal level of the analysis target frequency component extracted in step S4 described above, and storing an analysis result thereof as spectrum data representing a frequency-versus-signal-level correspondence relationship in a predetermined storage area (for example, the RAM).

While (or after) executing the analysis processing of the digital signal Dm in step S6, the spectrum data acquisition unit 18 reads out (acquires) the spectrum data stored in the RAM based on, for example, a predetermined spectrum display operation performed with the operation unit 20, and inputs the spectrum data to the display control unit 19 (step S7).

Further, the display control unit 19 performs display control of displaying, on the display unit 21, a waveform (graph (refer to the graph 60 in FIGS. 3A and 3B)) showing the spectrum characteristic of the digital signal Dm based on the spectrum data acquired from the spectrum data acquisition unit 18 (step S8).

Next, the details of the spectrum characteristic display control in step S8 of FIG. 4 will be described with reference to a flowchart of FIG. 5. As shown in FIG. 5, the display control of the spectrum characteristic in step S8 of FIG. 4 includes control of displaying the graph 60 (refer to FIGS. 3A and 3B) showing the spectrum characteristic (step S10), and the marker position setting display control via frequency designation of designating a desired frequency using the frequency marker 61 displayed in association with the graph 60 as a tool for inputting the frequency, changing the position of the frequency marker 61 to a position of the designated frequency, and updating the value of the frequency indicated by the frequency marker 61 (steps S11 to S15).

Figure 4:
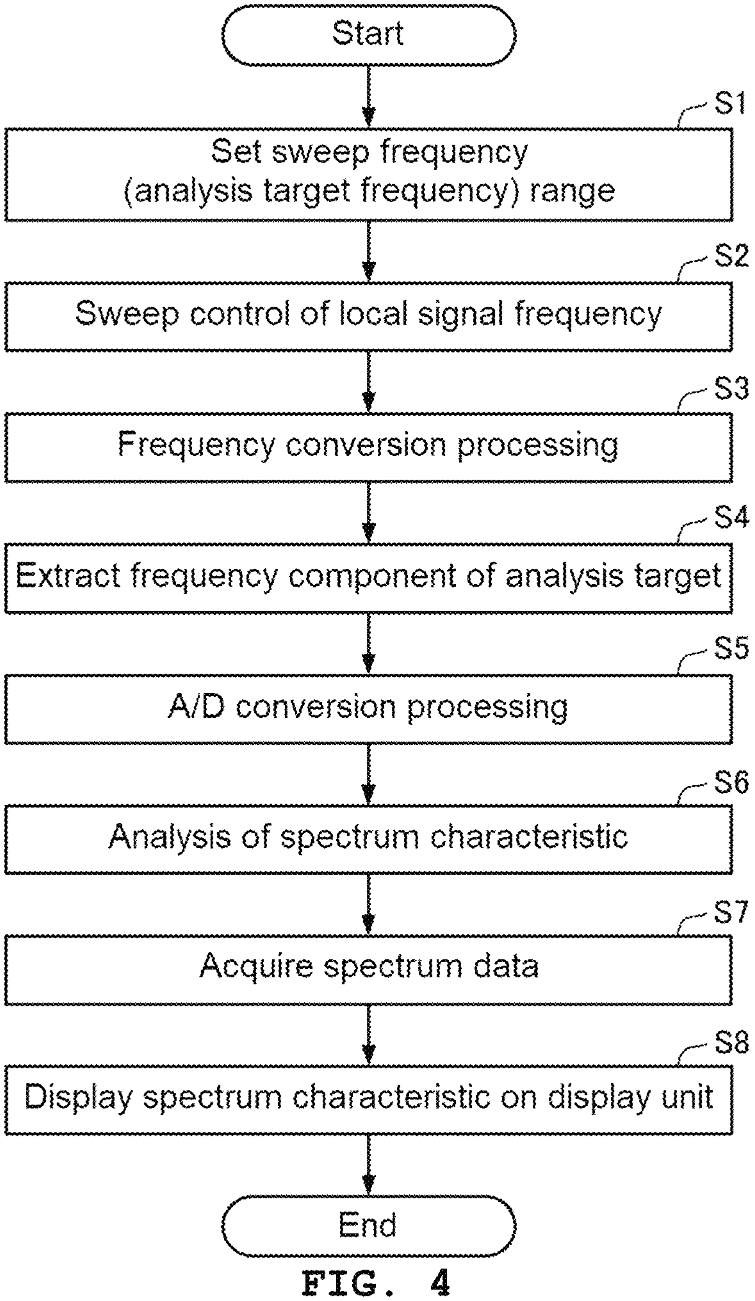
FIG. 4 is a flowchart showing a spectrum measurement operation via the spectrum analyzer according to the embodiment of the present invention.
Figure 5:
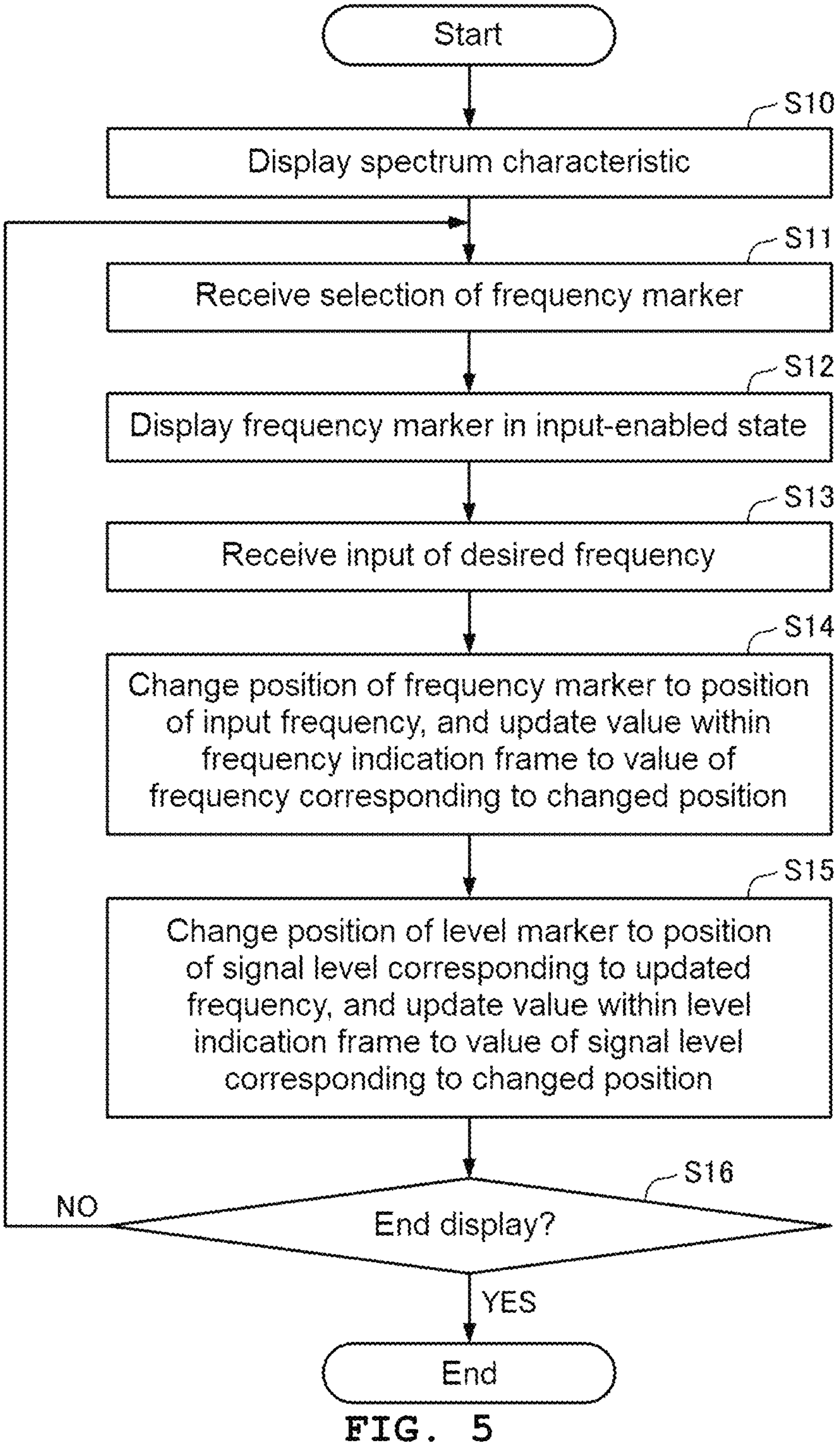
FIG. 5 is a flowchart showing a detailed operation of spectrum characteristic display processing of step S8 of FIG. 4 via the display control unit of the spectrum analyzer according to the embodiment of the present invention.

In the spectrum analyzer 1 according to the present embodiment, in a case where the display control of the spectrum characteristic is started in step S8 of FIG. 4, as shown in FIG. 5, the spectrum display control unit 31 displays the graph 60 of the spectrum characteristic using the spectrum display screen 50 (step S10).

During the display of the spectrum display screen 50, the input-enabled state display control unit 32 executes control of receiving an operation of selecting (clicking) the frequency marker 61 on the spectrum display screen 50 (step S11), and of displaying the frequency indication frame 61*a* of the frequency marker 61 in a mode (input-enabled state) in which the frequency indication frame 61*a* can be used as the frequency input tool (step S12).

Figure 7:
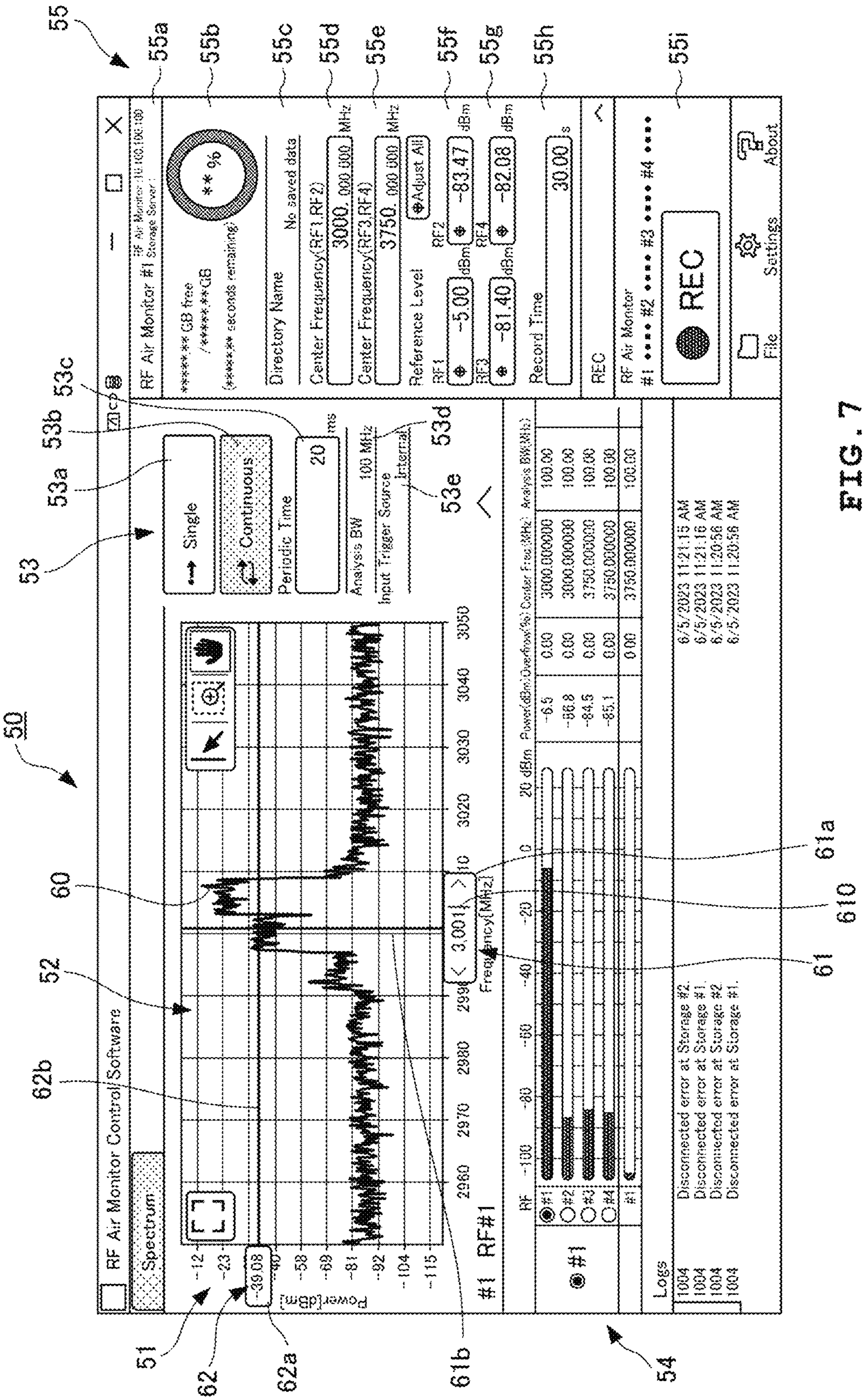
FIG. 7 is a diagram showing a display example of the spectrum display screen during marker position setting based on the marker position setting display control via the display control unit from a display content shown in FIG. 6.

Specifically, in step S12, the input-enabled state display control unit 32 performs, for example, display control of displaying the cursor 610 in the frequency indication frame 61*a* of the frequency marker 61, and of setting the cursor 610 to the input-enabled state (for example, blinking display), as shown in FIG. 7, in response to the selection of the frequency marker 61 by the user in step S11.

During the blinking display of the cursor 610 in step S12, the marker position setting request reception unit 33 performs processing of receiving the input of the desired frequency (the value of the frequency for which the change is requested) from the position of the cursor within the frequency indication frame 61*a* of the frequency marker 61 (step S13).

Here, in a case where the input of the desired frequency is received with the cursor within the frequency indication frame 61*a* as a starting point, the marker position setting display control unit 34 executes control of changing the position of the frequency marker 61 to the position of the input frequency, and of updating the value of the frequency within the frequency indication frame 61*a* to the value of the frequency corresponding to the changed position to display the updated value (step S14).

Subsequently, the marker position setting display control unit 34 executes control of changing the position of the level marker 62 to the position of the signal level corresponding to the position of the updated frequency, and of updating the display of the level indication frame 62*a* to the value of the signal level corresponding to the changed position to display the updated value (step S15).

Next, the marker position setting display control unit 34 checks whether or not an operation of ending the display of the spectrum display screen 50 is performed (step S16).

Here, in a case where the operation of ending the display of the spectrum display screen 50 is not performed (NO in step S16), the display control unit 19 transitions to step S11, and then performs the operation control from step S11 to step S16 described above.

Here, the display control unit 19 repeatedly performs the processing of steps S11 to S16 while determining in step S16 that the operation of ending the display of the spectrum characteristic is not performed. Meanwhile, in a case where the operation of ending the display of the spectrum characteristic is performed in step S16 (YES in step S16), a series of actions of the marker position setting display control described above for the frequency marker 61 and the level marker 62 are ended.

Next, specific display examples of the spectrum display screen 50 in the spectrum characteristic display control in step S10 of FIG. 5 and the spectrum display screen 50 in the marker position setting display control in steps S13 to S15 will be described with reference to FIGS. 6 and 7.

Figure 6:
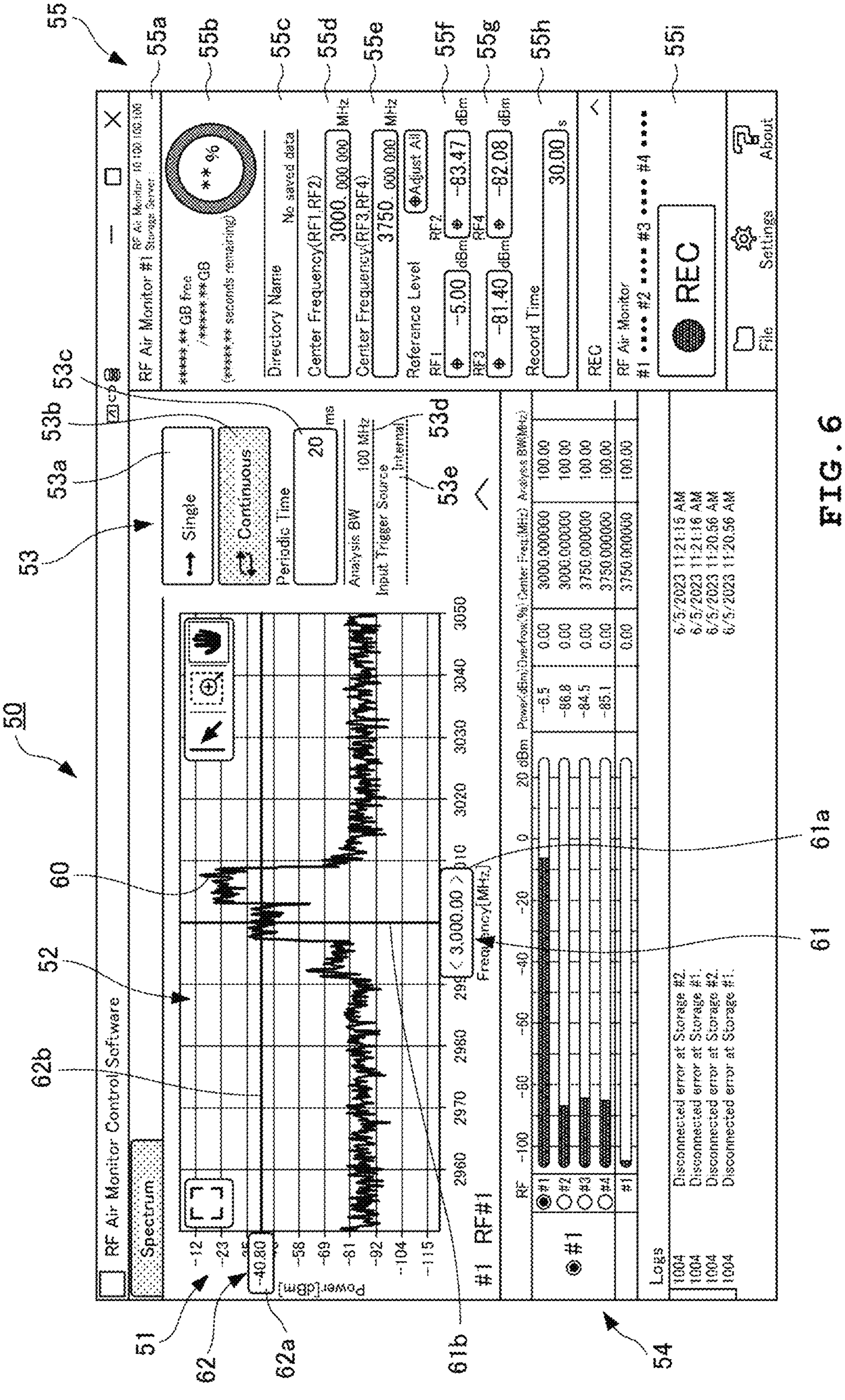
FIG. 6 is a diagram showing a detailed configuration and a display example of the spectrum display screen based on the display control of the display control unit of the spectrum analyzer according to the embodiment of the present invention.

A spectrum display screen 50 shown in FIGS. 6 and 7 shows a detailed embodiment of the spectrum display screen 50 shown in FIGS. 3A and 3B. As shown in FIGS. 6 and 7, the spectrum display screen 50 includes a graph display region 51, a measurement status display region 54, and a measurement status check region 55.

The graph display region 51 includes a graph region 52 in which the graph 60 of the spectrum characteristic is displayed, and a tool region 53 in which tools 53*a*, 53*b*, 53*c*, 53*d*, and 53*e* for displaying a setting status of a measurement condition of the spectrum characteristic displayed by the graph 60, and the like are disposed.

The graph region 52 is configured by a two-dimensional plane defined by the horizontal axis and the vertical axis, a scale of the frequency is provided on the horizontal axis, and a scale of the signal level is provided on the vertical axis. A unit of the frequency on the horizontal axis is, for example, "MHz", and in the examples of FIGS. 6 and 7, a frequency scale corresponding to a range of 2950 to 3050 MHz is provided. On the other hand, a unit of the signal level on the vertical axis is, for example, "dBm", and in the examples of FIGS. 6 and 7, a signal level scale corresponding to a range of −12 to −115 dBm is provided.

The graph region 52 displays the graph 60 showing the spectrum characteristic on the two-dimensional plane described above, and can display the frequency marker 61 and the level marker 62 in accordance with the display of the graph 60. The frequency marker 61 is composed of, for example, the frequency indication frame 61*a* having a rectangular shape, and is a tool function of displaying the value of the frequency on the horizontal axis indicated by the frequency marker 61 within the frame. At a point in time (initial screen) at which the graph 60 is first displayed based on basic display control of the spectrum display control unit 31 (display control in a case where the marker position setting display control is not applied), the frequency marker 61 indicates a value of a center frequency of an analysis target frequency range, which is set in advance (in the example of FIG. 6, 3000.00 MHz).

Also, the level marker 62 is composed of, for example, the level indication frame 62*a* having a rectangular shape, and is a tool function of displaying the value of the signal level on the vertical axis indicated by the frequency marker 61 within the frame. In the example of FIG. 6, the level marker 62 indicates the signal level of −40.80 dBm corresponding to the center frequency of 3000.00 MHz indicated by the frequency marker 61.

The frequency indication line 61*b* and the level indication line 62*b* are further displayed in association with the frequency marker 61 and the level marker 62, respectively. The frequency indication line 61*b* is formed of a line drawn continuously from the frequency marker 61 along the vertical axis to the value of the frequency indicated by the frequency marker 61, and the level indication line 62*b* is formed of a line drawn continuously from the level marker 62 along the horizontal axis to the value of the signal level indicated by the level marker 62. The frequency indication line 61*b* and the level indication line 62*b* intersect with each other at a point on the graph 60, and are useful for tools quickly and easily understanding the correspondence relationship (frequency versus signal level) between the frequency indicated by the frequency marker 61 and the signal level indicated by the level marker 62 from the point.

In the tool region 53 adjacent to the graph region 52 having the above-described configuration, each of the tools 53*a* and 53*b* is a tool that displays a setting status of whether to perform the measurement of the spectrum characteristic (graph 60) once ("Single") or continuously ("Continuous"). The tool 53*c* is a tool that displays a setting status (in this example, 20 ms) of a measurement period (Periodic Time). The tools 53*d* and 53*e* are tools that display the analysis interval (Analysis BW) and a setting status of the input signal type (Input Trigger Source), respectively. In the example of FIG. 6, a status in which 100 MHz is set for Analysis BW and Internal is set for Input Trigger Source is displayed.

In addition, in the spectrum display screen 50, in the measurement status display region 54 disposed below the graph display region 51, corresponding to a plurality of analysis target RF signals (in this example, four types of RF signals in different frequency bands identified by #1 to #4), the measurement results of the RF signals #1, #2, #3, and #4 are displayed as bar graphs and numerical values.

In addition, in the spectrum display screen 50, in the measurement status check region 55 disposed to the right of the graph display region 51, for example, a plurality of check items 55*a* to 55*i* related to one RF signal (in this example, the RF signal identified by #1) selected by the user from among the four analysis target RF signals #1, #2, #3, and #4 are displayed.

The check item 55*a* indicates which signal the analysis result is of, and in this example, it is displayed that the analysis result is of the RF signal #1.

The check item 55*b* displays a progress status of the analysis processing, for example, in a pie chart.

The check item 55*c* displays information indicating a storage status of the analysis result data, and in this example, it is displayed that information of No saved data (not stored) is stored in an item of Directory Name.

The check item 55*d* displays the center frequency of each analysis target RF signal. In this example, a value of the center frequency set in the analysis of the analysis target RF signals (RF1 and RF2 (corresponding to #1 and #2)) is displayed as 3000.000 000 MHz.

The check item 55*e* also displays the center frequency of each analysis target RF signal and, in this example, the value of the center frequency set in the analysis of the analysis target RF signals (RF3 and RF4 (corresponding to #3 and #4)) is displayed as 3750.000 000 MHz.

In the check item 55*f*, the analysis result of the signal level of the RF signal (RF1) and the RF signal (RF2) in a case where the setting value of the center frequency is 3000.000 000 MHz is displayed as −5.00 dBm and −83.47 dBm.

In the check item 55*g*, the analysis result of the signal level of the RF signal (RF3) and the RF signal (RF4) in a case where the setting value of the center frequency is 3750.000 000 MHz is displayed as −81.40 dBm and −82.08 dBm.

The check item 55*h* displays a recording time of the analysis result data indicating each of the above analysis results.

The check item 55*i* displays a REC button used in a case of recording the analysis results of the RF signals #1, #2, #3, and #4. The REC button is displayed such that start and end of the recording can be indicated.

Basic Operation of Spectrum Display Screen

In the spectrum analyzer 1 according to the present embodiment, during the measurement of the spectrum characteristic, the spectrum display control unit 31 displays, for example, the spectrum display screen 50 having the configuration shown in FIG. 6 based on the analysis result of the input signal $S_{IN}$ (refer to step S8 of FIG. 4 and step S10 of FIG. 5).

In the spectrum display screen 50 shown in FIG. 6, the analysis processing of the four RF signals #1 to #4 is performed, and the graph 60 showing the spectrum characteristic of the RF signal #1 (refer to the measurement status display region 54) among the RF signals #1 to #4 is displayed (refer to the graph region 52).

The user can recognize the analysis result of the spectrum characteristic in the frequency range of 2950 MHZ to 3050 MHz with the center frequency of 3000 MHz for the RF signal #1 from the graph 60.

On the spectrum display screen 50, the frequency marker 61 and the level marker 62 are displayed in association with the graph 60 in the graph region 52. Here, the frequency indication frame 61*a* of the frequency marker 61 indicates the center frequency (=3000.00 MHz), and the level indication frame 62*a* of the level marker 62 indicates the signal level of −40.80 dBm corresponding to the center frequency (=3000.00 MHZ). As a result, the user can check from the spectrum display screen 50 that the RF signal #1 has a signal level of approximately −40.80 dBm in the band of the center frequency.

With this spectrum display screen 50, as with the RF signal #1, also for the RF signals #2, #3, and #4, by selectively designating a desired RF signal via the selection operation in the measurement status display region 54, it is possible to check which signal level the center frequency thereof (note that the center frequencies of the RF signals #3 and #4 are 3750.00 MHz) has.

On the other hand, in some cases, the user may be required to check which signal level the RF signals #1 to #4 have for a frequency (any desired frequency such as a frequency in the vicinity of the center frequency) other than the center frequency. In this case, the user uses the frequency marker 61 associated with the graph 60 of the RF signal #1 being displayed (selected) as the input tool to activate the marker position setting display control described below.

Marker Position Setting Display Control of Spectrum Display Screen

In order to execute the marker position setting display control, first, an operation (click or the like) of selecting the frequency marker 61 displayed on the spectrum display screen 50 in association with the graph 60 is performed. This operation can be performed using, for example, the keyboard 20*a* constituting the operation unit 20.

By receiving the above operation, the input-enabled state display control unit 32 displays, for example, as shown in FIG. 7, a cursor 610 indicating the input position in a blinking state, that is, in a mode indicating an input-enabled state, within the frequency indication frame 61*a* of the frequency marker 61.

In this state, the user subsequently inputs a value of the desired frequency to the position of the cursor 610. FIG. 7 shows a state in which a frequency value of, for example, 3001 (GHz) is input to the frequency indication frame 61*a* of the frequency marker 61.

In a case where the input operation of the value of the desired frequency within the frequency indication frame 61*a* of the frequency marker 61 is received by the marker position setting request reception unit 33 via the above-described operation, the frequency marker 61 is changed to a position indicating the input frequency of 3001.00 MHz and displayed by the marker position setting display control unit 34. In accordance with this, the display content within the frequency indication frame 61*a* is changed from 3000.00 MHZ (refer to FIG. 6) before the input to 3001.00 MHz input as shown in FIG. 7, and is displayed.

Similarly, on the spectrum display screen 50, in a case where the RF signal #1 is selected, the marker position setting display control of changing the position of the frequency marker 61 to a position indicating the other desired frequency and changing the position of the level marker 62 to the position of the signal level corresponding to the other desired frequency to display the changed position can be performed through the selection designation of the frequency marker 61, the display of the cursor 610 within the frequency indication frame 61*a*, and the input operation of the other desired frequency with respect to the position of the cursor 610 within the frequency indication frame 61*a*.

In addition, even in a case where the RF signals #2, #3, and #4 are selected on the spectrum display screen 50, similarly, the marker position setting display control of changing the position of the frequency marker 61 to the position at which the designated frequency can be indicated, of displaying the value of the designated frequency within the frequency indication frame 61*a*, and of changing also the position of the level marker 62 to a position indicating the signal level corresponding the frequency displayed on the frequency indication frame 61*a* to display the signal level on the level indication frame 62*a* can be executed through the selection designation of the frequency marker 61, the display of the cursor 610 within the frequency indication frame 61*a*, and the input operation of the desired frequency with respect to the position of the cursor 610 within the frequency indication frame 61*a*.

Any of the selection designation of the frequency marker 61, the display of the cursor 610 within the frequency indication frame 61*a*, and the input operation of the desired frequency using the cursor 610 within the frequency indication frame 61*a* can be performed, for example, from the input means constituting the operation unit 20, for example, the keyboard 20*a* (refer to FIG. 2).

As described above, the spectrum analyzer 1 according to the present embodiment includes: the spectrum display control unit 31 that displays the spectrum display screen 50 including the graph region 52 defined by a horizontal axis having the scale of the frequency and the vertical axis having the scale of the signal level, and displays, on the graph region 52, the graph 60 showing the spectrum characteristic of the measured signal analyzed by the signal analysis unit 15, the frequency marker 61 including the frequency indication frame 61*a* indicating the value of the frequency on the horizontal axis corresponding to a point on the graph 60, and the level marker 62 including the level indication frame 62*a* indicating a value of a signal level on the vertical axis corresponding to the point; the input-enabled state display control unit 32 that displays the frequency indication frame 61*a* in the mode indicating the input-enabled state in which a desired frequency is inputtable, in response to the operation of selecting the frequency marker 61 via the keyboard 20*a* of the operation unit 20, during the display of the spectrum display screen 50; the marker position setting display control unit 34 that receives the input of the desired frequency to the frequency indication frame 61*a* via the keyboard 20*a* in a case of the input-enabled state, changes the position of the frequency marker 61 on the horizontal axis to the position of the input frequency, and updates the value of the frequency indicated by the frequency indication frame 61*a* to a value of the input frequency to display the updated value.

With this configuration, in the spectrum analyzer 1 according to the present embodiment, via a simple operation of inputting the desired frequency within the frequency indication frame 61*a* of the frequency marker 61, during the display of the spectrum display screen 50, using the frequency marker 61 displayed on the spectrum display screen 50 in association with the graph 60 and indicating the position of the frequency corresponding to the point on the graph 60 as a tool for inputting the value of the frequency for which the change is requested, it is possible to easily change the position of the frequency marker 61 to the position of the desired frequency. As a result, in a case of setting the position of the frequency marker 61, it is not necessary to perform any complicated work such as opening another screen and operating a physical encoder, and it is possible to significantly reduce the workload related to the position setting of the frequency marker 61.

In addition, in the spectrum analyzer 1 according to the present embodiment, the marker position setting display control unit 34 changes the position of the level marker 62 on the vertical axis to the position of the signal level corresponding to the updated frequency in accordance with the change of the position of the frequency marker 61, and updates the value of the signal level indicated by the level indication frame 62*a* to the value corresponding to the changed position of the signal level to display the updated value.

With this configuration, in the spectrum analyzer 1 according to the present embodiment, in a case of setting the position of the frequency marker 61, the position of the level marker 62 corresponding to the position of the frequency marker 61 after the setting can also be set simultaneously and easily, and load of a check work in a case where it is necessary to repeatedly check a frequency-versus-signal-level relationship for any desired frequency can be reduced.

In addition, in the spectrum analyzer 1 according to the present embodiment, the marker position setting display control unit 34 further displays, on the graph region 52, the frequency indication line 61*b* extending parallel to the vertical axis from the position of the frequency indicated by the frequency indication frame 61*a* and the level indication line 62*b* extending along the horizontal axis from the position of the signal level indicated by the level indication frame 62*a*.

With this configuration, in the spectrum analyzer 1 according to the present embodiment, even after the positions of the frequency marker 61 and the level marker 62 are set, waveforms in the vicinity of the intersection of both of the frequency indication line 61*b* and the level indication line 62*b* can be easily checked with reference to the frequency indication line 61*b* and the level indication line 62*b* on the graph 60 of the spectrum characteristic.

In addition, in the spectrum analyzer 1 according to the present embodiment, the signal analysis unit 15 analyzes the spectrum characteristics of a plurality of radio frequency (RF) signals having different frequency ranges in a millimeter wave band as the measured signal, and the spectrum display control unit 31 displays the graph 60 showing the spectrum characteristic of one RF signal that is selected from among the plurality of RF signals.

With this configuration, in the spectrum analyzer 1 according to the present embodiment, for any of the plurality of RF signals in each frequency range of the millimeter wave band, one RF signal can be selected from among the plurality of RF signals, and the positions of the frequency marker 61 and the level marker 62 can be set by a simple operation without requiring an operation such as opening another screen.

In addition, the frequency marker position setting method of the spectrum analyzer 1 according to the present embodiment is the frequency marker position setting method of the spectrum analyzer 1 including the spectrum display control unit 31 that displays the spectrum display screen 50 including the graph region 52 defined by the horizontal axis having the scale of the frequency and the vertical axis having the scale of the signal level, and for displaying, on the graph region 52, the graph 60 showing the spectrum characteristic of the measured signal analyzed by the signal analysis unit 15, the frequency marker 61 including the frequency indication frame 61*a* indicating the value of the frequency on the horizontal axis corresponding to a point on the graph 60, and the level marker 62 including the level indication frame 62*a* indicating the value of the signal level on the vertical axis corresponding to the point, and the frequency marker position setting method includes: an input-enabled state display control step (S12) of displaying the frequency indication frame 61*a* in the mode indicating the input-enabled state in which the desired frequency is inputtable, in response to the operation of selecting the frequency marker 61 via the keyboard 20*a* of the operation unit 20, during the display of the spectrum display screen 50; an input reception step (S13) of receiving the input of the desired frequency to the frequency indication frame 61*a* via the keyboard 20*a* in a case of the input-enabled state; and a frequency marker position setting display control step (S14) of changing the position of the frequency marker 61 on the horizontal axis to the position of the input frequency, and of updating the value of the frequency indicated by the frequency indication frame 61*a* to the value of the input frequency to display the updated value.

With this configuration, in the frequency marker position setting method of the spectrum analyzer 1 according to the present embodiment, via a simple operation of inputting the desired frequency within the frequency indication frame 61*a* of the frequency marker 61, during the display of the spectrum display screen 50, using the frequency marker 61 displayed on the spectrum display screen 50 in association with the graph 60 and indicating the position of the frequency corresponding to the point on the graph 60 as a tool for inputting the value of the frequency for which the change is requested (step S13), it is possible to easily change the position of the frequency marker 61 to the position of the desired frequency (step S14). As a result, in a case of setting the position of the frequency marker 61, it is not necessary to perform any complicated work such as opening another screen and operating a physical encoder, and it is possible to significantly reduce the workload related to the position setting of the frequency marker 61.

MODIFICATION EXAMPLE

In the above-described embodiment, a configuration in which the desired frequency is input to the frequency indication frame 61*a* of the frequency marker 61, the position of the frequency marker 61 is changed to the position corresponding to the input frequency, and the frequency indication value within the frequency indication frame 61*a* is updated to the frequency at the position after the change is described.

On the other hand, a spectrum analyzer 1A according to a modification example has a configuration in which a frequency marker setting method via movement of frequency marker 61 is provided, in which the frequency marker 61 displayed in association with the graph 60 is moved (the frequency marker 61 is displayed as movable) along the horizontal axis (frequency axis) in the graph region 52 of a spectrum display screen 50A (refer to FIGS. 9 and 10) while the position of the graph 60 being fixed, and a value of a frequency corresponding to the moved position of the frequency marker 61 is sequentially updated and displayed within the frequency indication frame 61*a*.

Figure 8:
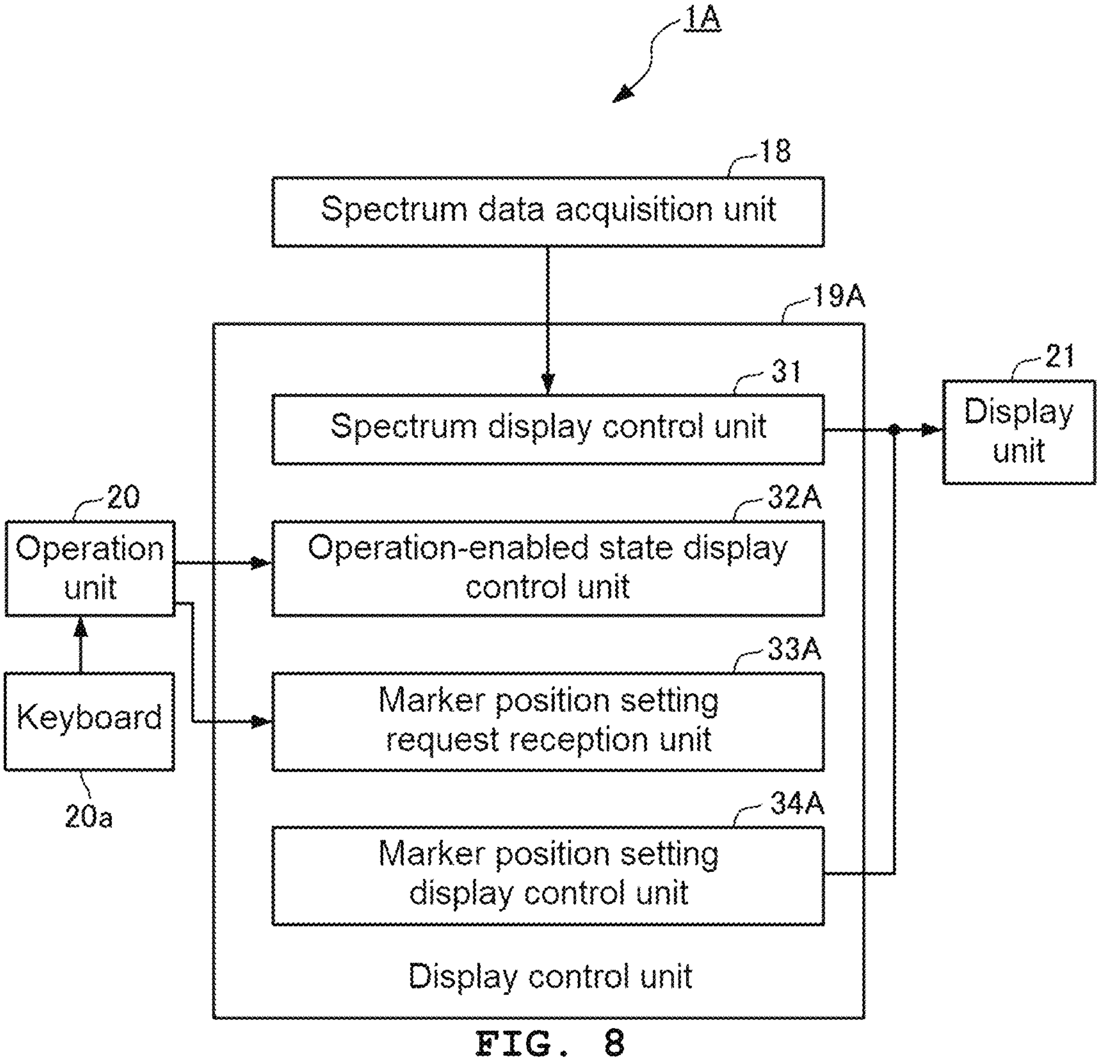
FIG. 8 is a block diagram showing a functional configuration of a display control unit in a spectrum analyzer according to a modification example of the present invention.
Figure 9:
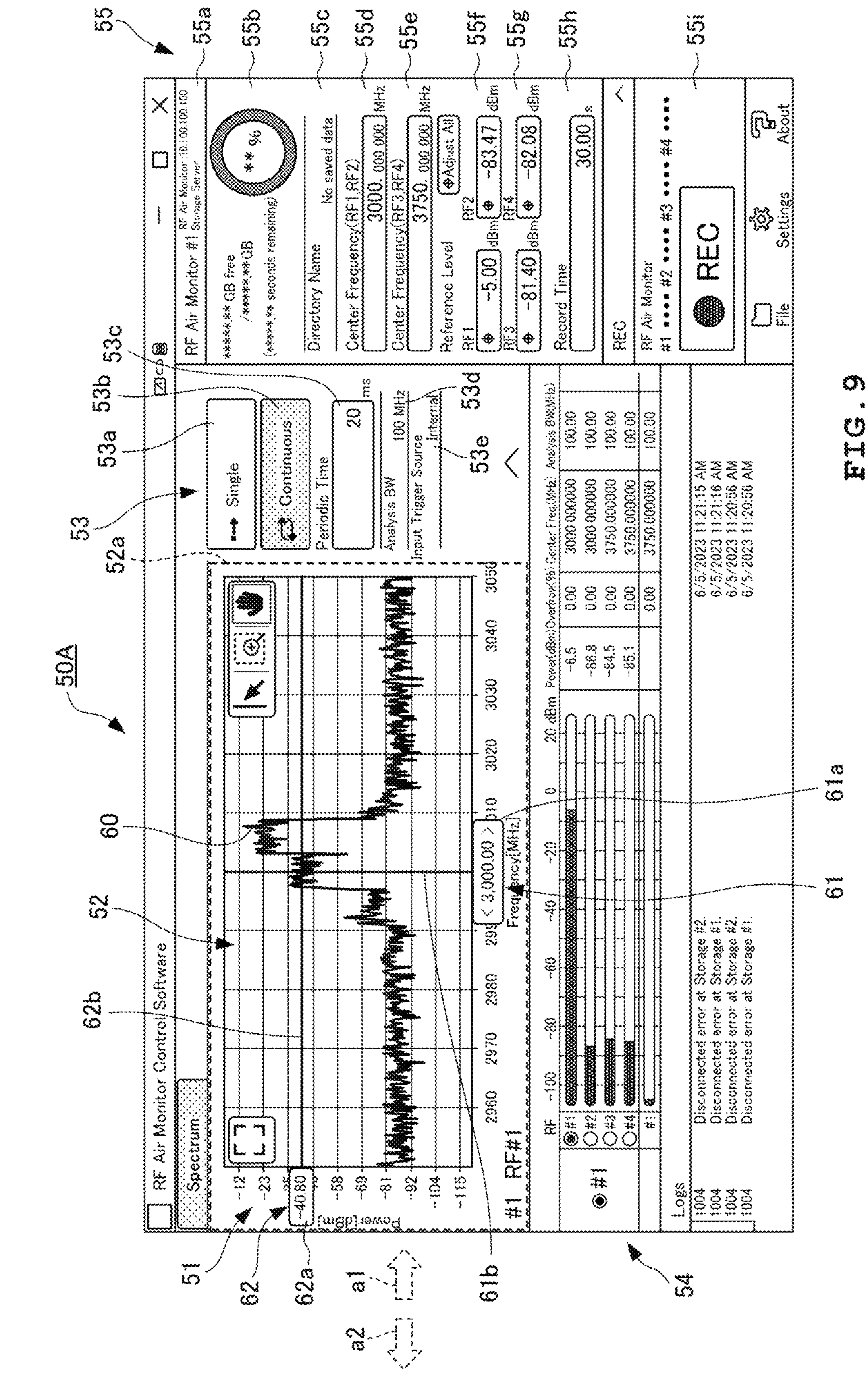
FIG. 9 is a diagram showing a detailed display example of a spectrum display screen in a case where a frame of a displayed in an operation-enabled state during display in the spectrum analyzer according to the modification example of the present invention.
Figure 10:
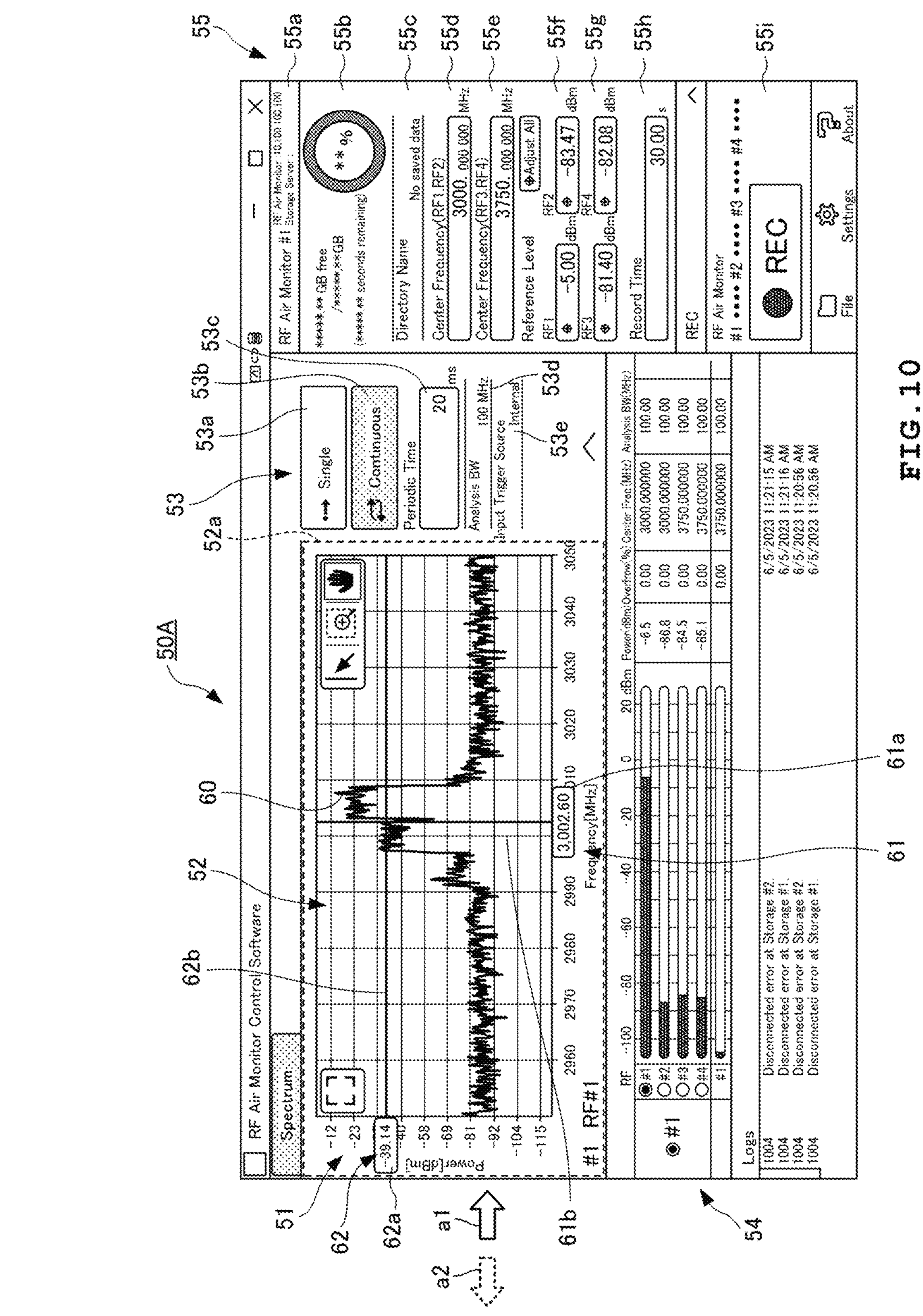
FIG. 10 shows a display example of a spectrum display screen in a case where a movement operation of a frequency marker is received from the operation-enabled state shown in FIG. 9 and marker position setting control is performed.

FIG. 8 shows a configuration of a display control unit 19A of the spectrum analyzer 1A according to the modification example. In addition, FIGS. 9 and 10 show display examples of the spectrum display screen 50A used in the spectrum analyzer 1A according to the modification example. FIG. 9 shows a display example of the spectrum display screen 50A in a case where the selection of the graph region 52 is received and a frame 52*a* of the graph region 52 is in the operation-enabled (the movement operation of the frequency marker 61 is enabled) state, and FIG. 10 shows a display example of the spectrum display screen 50A in a case where the movement operation of the frequency marker 61 is received from the operation-enabled state and the marker position setting based on the marker position setting display control is performed.

The spectrum analyzer 1A according to the modification example has the same basic structure as the spectrum analyzer 1 (refer to FIG. 1) according to the embodiment described above, and has a configuration in which only the display control unit 19A is different from the display control unit 19 of the spectrum analyzer 1 according to the embodiment described above.

As shown in FIG. 8, in the spectrum analyzer 1A according to the modification example, the display control unit 19A includes a spectrum display control unit 31, an operation-enabled state display control unit 32A, a marker position setting request reception unit 33A, and a marker position setting display control unit 34A. In FIG. 8, the same reference numerals are added to portions having the same configuration as the display control unit 19 (refer to FIG. 2) of the spectrum analyzer 1 according to the embodiment described above.

In the configuration of the display control unit 19A shown in FIG. 8, the operation-enabled state display control unit 32A is a functional unit that displays, for example, a frame 52*a* surrounding the graph region 52 on the spectrum display screen 50A in a mode indicating a state (operation-enabled state) in which the movement operation of the frequency marker 61 is receivable, in response to the operation of the user to select the graph region 52 on the spectrum display screen 50A. Examples of a mode indicating the operation-enabled state of the graph region 52 include a method of displaying the frame 52*a* of the graph region 52 in a blinking state as shown in FIGS. 9 and 10. The operation-enabled state display control unit 32A constitutes operation-enabled state display control means according to the embodiment of the present invention.

The marker position setting request reception unit 33A is a functional unit that performs processing of receiving an operation (an operation of the marker position setting request) of moving the frequency marker 61 along the horizontal axis within the graph region 52 displayed in a mode indicating the operation-enabled state. The movement of the frequency marker 61 along the horizontal axis can be indicated, for example, in response to the operation of a left movement button or a right movement button of a keyboard 20*a* (refer to FIG. 2) that is one of the devices constituting the operation unit 20.

The marker position setting display control unit 34A has a function of displaying the position of the frequency marker 61 while moving the position of the frequency marker 61 in the right direction or the left direction along the horizontal axis with respect to the graph 60 displayed at the fixed position by receiving the operation (the operation of the marker position selection request) of moving the frequency marker 61 to the left or to the right via the left movement button or the right movement button.

In addition, the marker position setting display control unit 34A has a frequency marker position setting display control function of sequentially updating the frequency indication value within the frequency indication frame 61*a* to the value of the frequency corresponding to the position after the change (the value of the frequency on the graph 60 at which the frequency indication line 61*b* extending along the vertical axis from the frequency marker 61 intersects) in accordance with the change of the position of the frequency marker 61 to display the updated value.

Further, the marker position setting display control unit 34A performs display control of changing the position of the level marker 62 to the position of the value of the signal level corresponding to the value of the updated frequency within the frequency indication frame 61*a* of the frequency marker 61, and of updating the value of the signal level within the level indication frame 62*a* to the value of the signal level corresponding to the value of the updated frequency within the frequency indication frame 61*a* of the frequency marker 61 (the value of the signal level on the graph 60 at which the level indication line 62*b* extending along the horizontal axis from the level marker 62 intersects) to display the updated value. The marker position setting display control unit 34A constitutes marker position setting display control means according to the embodiment of the present invention.

Next, a marker position setting display control operation via the movement of the frequency marker 61 using the spectrum display screen 50A in the spectrum analyzer 1A according to the modification example will be described with reference to a flowchart shown in FIG. 11.

In the spectrum analyzer 1A according to the modification example, a spectrum characteristic measurement operation is performed according to the flowchart shown in FIG. 4. During the spectrum characteristic measurement operation, in the processing of displaying the spectrum characteristic in step S8, the display control unit 19A executes, in detail, as shown in FIG. 11, the display control (step S10) of the graph 60 (refer to FIG. 9) showing the spectrum characteristic, and the marker position setting display control (steps S11A, S12A, S13A, S14A, and S15A) via the movement of the frequency marker 61, in which the display content (frequency indication value) of the frequency indication frame 61*a* of the frequency marker 61 and the display content (signal level indication value) of the level indication frame 62*a* of the level marker 62 are updated and displayed in accordance with the operation of moving the frequency marker 61.

Figure 11:
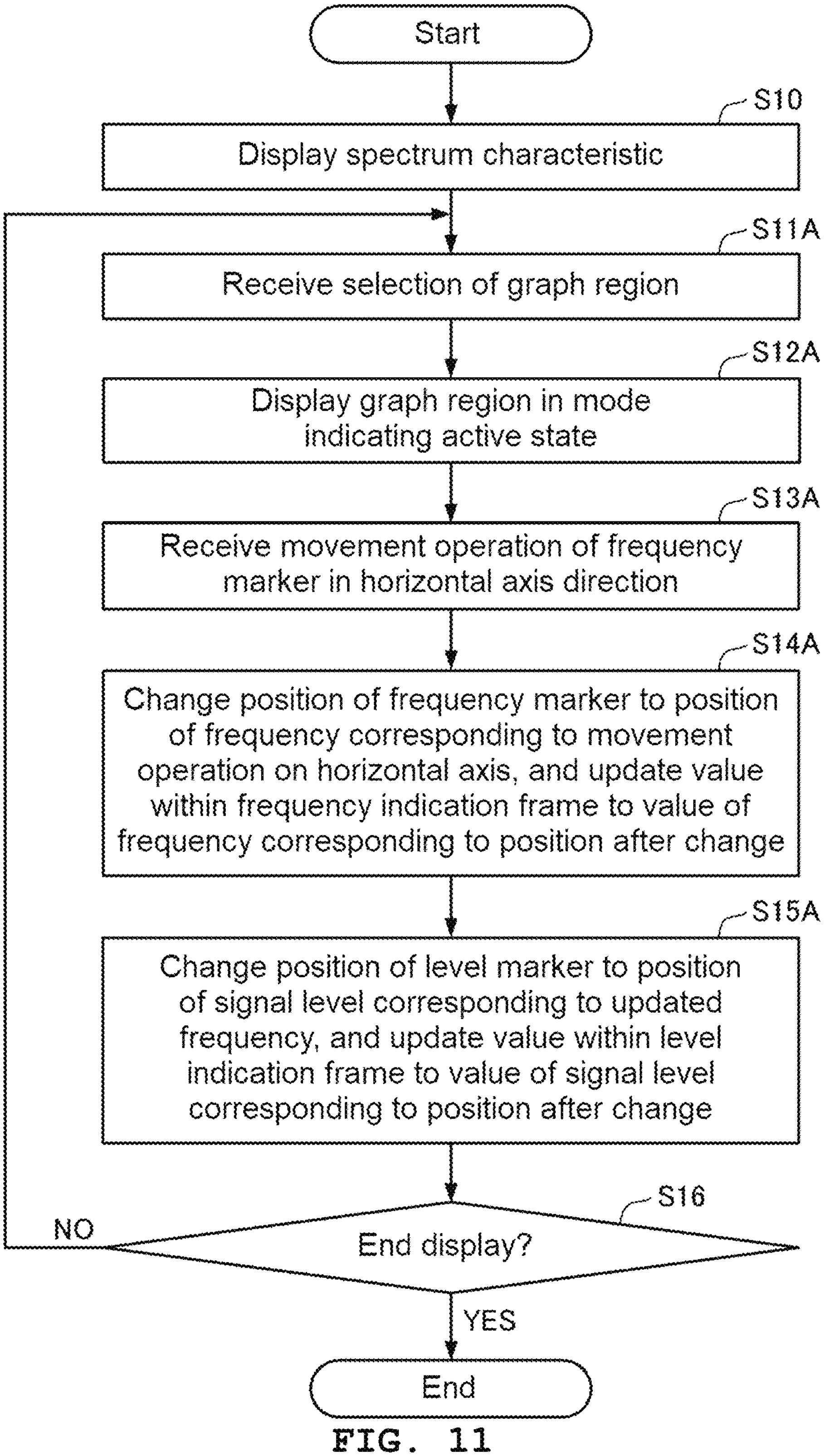
FIG. 11 is a flowchart showing detailed operation of the spectrum characteristic display processing of step S8 of FIG. 4 via the display control unit of the spectrum analyzer to the according modification example of the present invention.
Figure 12:
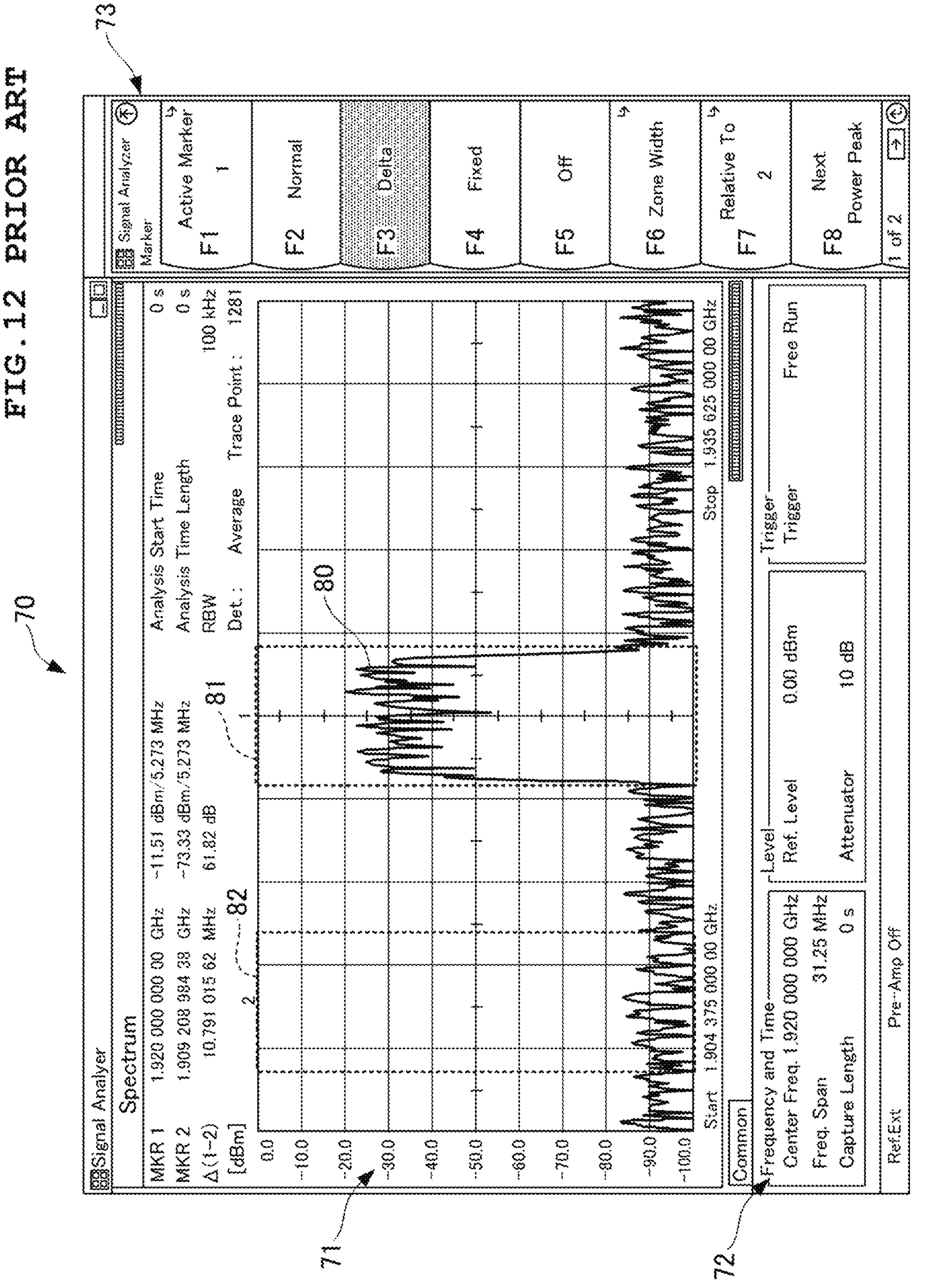
FIG. 12 PRIOR ART
FIG. 12 is a diagram showing a display example of a spectrum display screen related to zone marker setting processing of a spectrum analyzer according to the related art.

In the spectrum analyzer 1A according to the modification example, in a case where the display control of the spectrum characteristic is started in step S8 of FIG. 4, as shown in FIG. 11, the spectrum display control unit 31 displays the graph 60 of the spectrum characteristic using the spectrum display screen 50A shown in FIG. 9 (step S10). The spectrum display screen 50A displayed here is the same as the spectrum display screen 50 (refer to FIG. 6) used in the spectrum analyzer 1 according to the embodiment described above, except that the frequency marker 61 is displayed as movable in a horizontal axis direction and the frame 52*a* surrounding the graph region 52 can be displayed in the mode indicating the operation-enabled state.

During the display of the spectrum display screen 50A, the operation-enabled state display control unit 32A receives an operation of selecting (clicking) the graph region 52 on the spectrum display screen 50 (step S11A), and performs display control of displaying the graph region 52 in a mode indicating a state (operation-enabled state) in which a movement operation in the horizontal axis direction of the frequency marker 61 is receivable (step S12A).

Specifically, in step S12A, the operation-enabled state display control unit 32A performs, for example, display control of displaying the frame 52*a* surrounding the graph region 52 (graph 60), for example, in a blinking state indicating that the frame 52*a* is in the operation-enabled state (active state), as shown in FIG. 9, in response to the selection of the graph region 52 by the user in step S11A. In FIG. 9, the frame 52*a* surrounding the graph region 52 is shown by a dotted line to indicate that the graph region 52 is displayed in a blinking manner.

During the blinking display of the frame 52*a* surrounding the graph region 52 in step S12A, the marker position setting request reception unit 33A performs processing of receiving the movement operation of the frequency marker 61 within the graph region 52 in the horizontal axis direction (step S13A).

Here, the user can appropriately move the frequency marker 61 to the right or left direction along the horizontal axis by operating, for example, a left movement key and a lateral movement key of the keyboard 20*a* constituting the operation unit 20. In this case, the position of the graph 60 does not change, and is always fixed and displayed, for example, in the vicinity of a center position of the horizontal axis.

As a result, in the spectrum display screen 50A, in a case where the frequency marker 61 is operated to move to the right (the direction of an arrow a1 in FIG. 9) in the spectrum display screen 50A shown in FIG. 9, the value of the frequency indicated by the frequency indication frame 61*a* of the frequency marker 61 is changed to a higher frequency in order from 3000.00 MHZ, and conversely, in a case where the frequency marker 61 is operated to move to the left (the direction of an arrow a2 in FIG. 9), the value of the frequency indicated by the frequency indication line 61*b* of the frequency marker 61 is changed to a lower frequency in order from 3000.00 MHZ.

In step S13A, in a case where the marker position setting request reception unit 33A receives the movement operation of the frequency marker 61 in the horizontal axis direction, the marker position setting display control unit 34A performs processing of changing the position of the frequency marker 61 to the position of the frequency corresponding to the movement operation on the horizontal axis and of sequentially updating the display content within the frequency indication frame 61*a* to the value of the frequency corresponding to the position after the change to display the updated content, while maintaining the graph 60 at the fixed position (step S14A).

In this case, for the level marker 62, the marker position setting display control unit 34A performs control of sequentially updating the position of the level marker 62 to change the position to the position of the signal level corresponding to the value of the frequency displayed in the frequency indication frame 61*a* of the frequency marker 61, and of sequentially updating the display content within the level indication frame 62*a* of the level marker 62 to the value of the signal level corresponding to the position after the change to display the updated content (step S15A).

Subsequently, the marker position setting display control unit 34A checks whether or not the operation of ending the display of the spectrum display screen 50A is performed (step S16).

Here, in a case where the operation of ending the display of the spectrum display screen 50A is not performed (NO in step S16), the display control unit 19A transitions to step S11A, and then performs the operation control from step S11A to step S16 described above.

The display control unit 19A repeatedly performs the processing of steps S11A to S16 while it is determined in step S16 that the operation of ending the display of the spectrum characteristic is not performed. Meanwhile, in a case where the operation of ending the display of the spectrum characteristic is performed in step S16 (YES in step S16), a series of actions of the marker position setting display control described above for the frequency marker 61 and the level marker 62 are ended.

Next, specific display examples of the spectrum display screen 50A in the spectrum characteristic display control in step S10 of FIG. 11 and the spectrum display screen 50A related to the marker position setting display control via the movement of the frequency marker 61 in steps S11A, S12A, S13A, S14A, and S15A will be described in more detail with reference to FIGS. 9 and 10.

Basic Operation of Spectrum Display Screen

In the spectrum analyzer 1A according to the modification example, during the measurement of the spectrum characteristic, for example, a spectrum display screen 50A having the configuration shown in FIG. 9 is displayed based on the analysis result of the input signal $S_{IN}$ (refer to step S8 of FIG. 4 and step S10 of FIG. 11).

In the spectrum display screen 50A shown in FIG. 9, with regard to the graph 60 of the spectrum characteristic of the RF signal #1, the frequency marker 61 indicates the center frequency (=3000.00 MHZ), and the level marker 62 indicates the signal level of −40.80 dBm corresponding to the center frequency (=3000.00 MHZ). As a result, the user can check that the RF signal #1 has a signal level of approximately −40.80 dBm with respect to the center frequency from the spectrum display screen 50A.

According to the spectrum display screen 50A, via the same operation, for not only the RF signal #1 but also the RF signals #2, #3, and #4, by selectively designating a desired RF signal via the selection operation in the measurement status display region 54, it is possible to check which signal level the center frequency (note that the center frequency of the RF signals #3 and #4 are 3750.00 MHz) has.

On the other hand, in a case where it is required to check which signal level any desired frequency such as the frequency in the vicinity of the center frequency has, for the RF signals #1 to #4, the user activates the marker position setting display control via the movement of the frequency marker 61 in which the value of the frequency indicated by the frequency indication frame 61*a* is sequentially updated while moving the frequency marker 61 in the horizontal axis direction on the spectrum display screen 50A being displayed (selected).

Marker Position Setting Display Control Via Movement of Frequency Marker on Spectrum Display Screen In order to execute the marker position setting display control via the movement of the frequency marker, the user first performs an operation (clicking or the like) of selecting the graph region 52 of the spectrum display screen 50A.

By receiving the above operation, the operation-enabled state display control unit 32A displays, for example, the frame 52*a* surrounding the graph region 52 in an active state as shown in FIG. 9. In the example of FIG. 9, the frame 52*a* is represented by, for example, a dotted line, and indicates that the frame 52*a* is in a blinking state.

In this state, next, the user performs an operation of moving the frequency marker 61 displayed in association with the graph 60 within the graph region 52 in a desired right or left direction (the arrow a1 direction or the arrow direction) via the operation unit 20. The movement operation of the frequency marker 61 can be performed by using, for example, the keyboard 20*a* constituting the operation unit 20 by pressing a right movement key or the left movement key.

In FIG. 9, in a case where an operation of moving the frequency marker 61 in, for example, the right direction (arrow a1 direction) is performed, the value of the frequency indicated by the frequency indication frame 61*a* is gradually updated to a higher frequency. On the contrary, in a case where the operation of moving the frequency marker 61 in, for example, the left direction (arrow a2 direction) is performed, the value of the frequency indicated by the frequency indication frame 61*a* is gradually updated to a lower frequency.

FIG. 10 shows a display example of the spectrum display screen 50A in a case where the movement operation is performed on the frequency marker 61 in the arrow a1 direction such that the value of the frequency indicated by the frequency indication frame 61*a* is gradually updated to a higher frequency. FIG. 10 particularly shows a display example of the spectrum display screen 50A in a case where the position of the frequency marker 61 is continuously changed to the right direction up to the position indicating 3002.60 MHZ.

In this case, the position of the level marker 62 is changed to a position indicating a signal level corresponding to the frequency of 3002.60 MHz displayed within the frequency indication frame 61*a*, and the value of the signal level displayed within the level indication frame 62*a* is updated to a signal level of −39.14 dBm corresponding to the frequency of 3002.60 MHz in the graph 60 and displayed.

In the spectrum analyzer 1A according to the modification example, during the display of the spectrum display screen 50A shown in FIG. 10, by performing the movement operation on the position of the frequency marker 61 to further indicate any other frequency, it is possible to check frequency-versus-signal-level relationship corresponding to any frequency for the RF signal #1. Similarly, for the other RF signals #2, #3, and #4, the signal level values corresponding to the values of any frequency can be checked one by one through the selection designation of the graph region 52, the display of the active state of the graph region 52, and the movement operation of the frequency marker 61.

As described above, the spectrum analyzer 1A according to the modification example includes: the spectrum display control unit 31 that displays the spectrum display screen 50A including the graph region 52 defined by a horizontal axis having the scale of the frequency and the vertical axis having the scale of the signal level, and displays, on the graph region 52, the graph 60 showing the spectrum characteristic of the measured signal analyzed by the signal analysis unit 15, the frequency marker 61 including the frequency indication frame 61*a* indicating the value of the frequency on the horizontal axis corresponding to a point on the graph 60, and the level marker 62 including the level indication frame 62*a* indicating a value of a signal level on the vertical axis corresponding to the point; the operation-enabled state display control unit 32A that displays the graph region 52 in a mode indicating the operation-enabled state in which the movement operation of the frequency marker 61 along the horizontal axis is receivable, in response to the operation of selecting the graph 60 via the keyboard 20*a* of the operation unit 20, during the display of the spectrum display screen 50; and the marker position setting display control unit 34A that receives the movement operation of the frequency marker 61 via the keyboard 20*a* in a case of the operation-enabled state, changes the position of the frequency marker 61 to the position of the frequency corresponding to the movement operation, and updates the value of the frequency indicated by the frequency indication frame 61*a* to the value of the frequency at the position after the change to display the updated value.

With this configuration, in the spectrum analyzer 1A according to the modification example, via a simple operation of moving the position of the frequency marker 61 to the position of the desired frequency, during the display of the spectrum display screen 50, using the frequency marker 61 displayed on the spectrum display screen 50 in association with the graph 60 and indicating the position of the frequency corresponding to the point on the graph 60 as a tool capable of being moved to the position of the frequency for which the change is requested, it is possible to easily change the position of the frequency marker 61 to the position of the desired frequency. As a result, in a case of setting the position of the frequency marker 61, it is not necessary to perform any complicated work such as opening another screen and operating a physical encoder, and it is s possible to significantly reduce the workload related to the position setting of the frequency marker 61.

In the spectrum analyzer 1A according to the modification example, the other configurations are the same as those of the spectrum analyzer 1 according to the embodiment described above, and the same effects as those of the spectrum analyzer 1 according to the embodiment described above can be obtained for these configurations.

In addition, the frequency marker position setting method of the spectrum analyzer 1A according to the modification example is the frequency marker position setting method of the spectrum analyzer 1A including the spectrum display control unit 31 that displays the spectrum display screen 50A including the graph region 52 defined by the horizontal axis having the scale of the frequency and the vertical axis having the scale of the signal level, and for displaying, on the graph region 52, the graph 60 showing the spectrum characteristic of the measured signal analyzed by the signal analysis unit 15, the frequency marker 61 including the frequency indication frame 61*a* indicating the value of the frequency on the horizontal axis corresponding to a point on the graph 60, and the level marker 62 including the level indication frame 62*a* indicating the value of the signal level on the vertical axis corresponding to the point, and the frequency marker position setting method includes: an operation-enabled state display control step (S12A) of displaying the graph region 52 in a mode indicating the operation-enabled state in which the movement operation of the frequency marker 61 along the horizontal axis is receivable, in response to an operation of selecting the graph 60 via the keyboard 20*a* of the operation unit 20, during the display of the spectrum display screen 50; an operation reception step (S13A) of receiving the movement operation of the frequency marker 61 via the keyboard 20*a* in a case of the operation-enabled state; and a frequency marker position setting display control step (S14A) of changing the position of the frequency marker 61 to the position of the frequency corresponding to the movement operation, and of updating the value of the frequency indicated by the frequency indication frame 61*a* to the value of the frequency at the position after the change to display the updated value.

With this configuration, in the frequency marker position setting method of the spectrum analyzer 1A according to the modification example, via a simple operation of moving the position of the frequency marker 61 to the position of the desired frequency, during the display of the spectrum display screen 50, using the frequency marker 61 displayed on the spectrum display screen 50 in association with the graph 60 and indicating the position of the frequency corresponding to the point on the graph 60 as a tool capable of being moved to the position of the frequency for which the change is requested (S13A), it is possible to easily change the position of the frequency marker 61 to the position of the desired frequency (S14A).

As a result, in a case of setting the position of the frequency marker 61, it is not necessary to perform any complicated work such as opening another screen and operating a physical encoder, and it is possible to significantly reduce the workload related to the position setting of the frequency marker 61.

INDUSTRIAL APPLICABILITY

As described above, the present invention has an effect that a frequency marker position can be efficiently set with a small amount of work without requiring work such as opening another screen and operating a physical encoder during display of a spectrum display screen, and is useful in general for a spectrum analyzer that analyzes a spectrum characteristic and displays the spectrum characteristic in a graph, and a frequency marker position setting method of the same.

DESCRIPTION OF REFERENCE NUMERALS AND SIGNS

1, 1A: spectrum analyzer
10: frequency conversion unit
11: mixer
12: local signal generator
13: filter
14: analog/digital (A/D) converter
15: signal analysis unit (signal analysis means)
16: control unit
17: frequency sweep control unit
18: spectrum data acquisition unit
19, 19A: display control unit
20: operation unit
20*a*: keyboard (input means)
21: display unit
31: spectrum display control unit (spectrum display control means)
32: input-enabled state display control unit (input-enabled state display control means)
32A: operation-enabled state display control unit (operation-enabled state display control means)
33, 33A: marker position setting request reception unit
34, 34A: marker position setting display control unit (frequency marker position setting display control means)
50, 50A: spectrum display screen
51: graph display region
52: graph region
52*a*: frame
53: tool region
54: measurement status display region
55: measurement status check region
60: graph
61: frequency marker
61*a*: frequency indication frame
61*b*: frequency indication line
62: level marker
62*a*: level indication frame
62*b*: level indication line
Dm: digital signal
f: frequency information
L: local signal
M: intermediate frequency (IF) band signal
$S_{IN}$: input signal

What is claimed is:

1. A spectrum analyzer comprising:

spectrum display control means for displaying a spectrum display screen including a graph region defined by a horizontal axis having a scale of a frequency and a vertical axis having a scale of a signal level, and for displaying, on the graph region, a graph showing an entire spectrum characteristic of a measured signal analyzed by signal analysis means, a frequency marker including a frequency indication frame indicating a value of a frequency on the horizontal axis corresponding to a point on the graph, and a level marker including a level indication frame indicating a value of a signal level on the vertical axis corresponding to the point;

input-enabled state display control means for displaying the frequency indication frame in a mode indicating an input-enabled state in which a desired frequency is inputtable, in response to an operation of selecting the frequency marker via input means, during the display of the spectrum display screen;

operation-enabled state display control means for displaying the graph region in a mode indicating an operation-enabled state in which a movement operation of the frequency marker along the horizontal axis is receivable, in response to an operation of selecting the graph via the input means, during the display of the spectrum display screen; and frequency marker position setting display control means for receiving the input of the desired frequency to the frequency indication frame via the input means in a case of the input-enabled state, for changing a position of the frequency marker on the horizontal axis to a position of the input frequency, for updating the value of the frequency indicated by the frequency indication frame to a value of the input frequency to display the updated value, for receiving the movement operation of the frequency marker via the input means in a case of the operation-enabled state, for changing the position of the frequency marker to a position of a frequency corresponding to the movement operation, and for updating the value of the frequency indicated by the frequency indication frame to a value of the frequency at the position after the change to display the updated value, wherein the graph showing the entire spectrum characteristic of the measured signal remains displayed on the graph region during the input-enabled state and the operation-enabled state.

2. The spectrum analyzer according to claim 1, wherein the frequency marker position setting display control means changes a position of the level marker on the vertical axis to a position of a signal level corresponding to the updated frequency in accordance with the change of the position of the frequency marker, and updates the value of the signal level indicated by the level indication frame to a value corresponding to the changed position of the signal level to display the updated value.

3. The spectrum analyzer according to claim 1, wherein the frequency marker position setting display control means further displays, on the graph region, a frequency indication line extending parallel to the vertical axis from a position of the frequency indicated by the frequency indication frame and a level indication line extending along the horizontal axis from a position of the signal level indicated by the level indication frame.

4. The spectrum analyzer according to claim 1, wherein the signal analysis means analyzes the spectrum characteristics of a plurality of radio frequency signals having different frequency ranges in a millimeter wave band as the measured signal, and the spectrum display control means displays the graph showing the spectrum characteristic of one radio frequency signal that is selected from among the plurality of radio frequency signals.

5. A frequency marker position setting method of a spectrum analyzer including spectrum display control means for displaying a spectrum display screen including a graph region defined by a horizontal axis having a scale of a frequency and a vertical axis having a scale of a signal level, and for displaying, on the graph region, a graph showing an entire spectrum characteristic of a measured signal analyzed by signal analysis means, a frequency marker including a frequency indication frame indicating a value of a frequency on the horizontal axis corresponding to a point on the graph, and a level marker including a level indication frame indicating a value of a signal level on the vertical axis corresponding to the point, the frequency marker position setting method comprising:

an input-enabled state display control step of displaying the frequency indication frame in a mode indicating an input-enabled state in which a desired frequency is inputtable, in response to an operation of selecting the frequency marker via input means, during the display of the spectrum display screen;

an input reception step of receiving the input of the desired frequency to the frequency indication frame via the input means in a case of the input-enabled state; and a frequency marker position setting display control step of changing a position of the frequency marker on the horizontal axis to a position of the input frequency, and of updating the value of the frequency indicated by the frequency indication frame to a value of the input frequency to display the updated value, wherein the graph showing the entire spectrum characteristic of the measured signal remains displayed on the graph region during the input-enabled state and an operation-enabled state.

6. The frequency marker position setting method of a spectrum analyzer according to claim 5, further comprising:

a step of changing a position of the level marker on the vertical axis to a position of a signal level corresponding to the updated frequency in accordance with the change of the position of the frequency marker, and updating the value of the signal level indicated by the level indication frame to a value corresponding to the changed position of the signal level to display the updated value.

7. A frequency marker position setting method of a spectrum analyzer including spectrum display control means for displaying a spectrum display screen including a graph region defined by a horizontal axis having a scale of a frequency and a vertical axis having a scale of a signal level, and for displaying, on the graph region, a graph showing an entire spectrum characteristic of a measured signal analyzed by signal analysis means, a frequency marker including a frequency indication frame indicating a value of a frequency on the horizontal axis corresponding to a point on the graph, and a level marker including a level indication frame indicating a value of a signal level on the vertical axis corresponding to the point, the frequency marker position setting method comprising:

an operation-enabled state display control step of displaying the graph region in a mode indicating an operation-enabled state in which a movement operation of the frequency marker along the horizontal axis is receivable, in response to an operation of selecting the graph via input means, during the display of the spectrum display screen;

an operation reception step of receiving the movement operation of the frequency marker via the input means in a case of the operation-enabled state; and a frequency marker position setting display control step of changing a position of the frequency marker to a position of a frequency corresponding to the movement operation, and of updating the value of the frequency indicated by the frequency indication frame to a value of the frequency at the position after the change to display the updated value, wherein the graph showing the entire spectrum characteristic of the measured signal remains displayed on the graph region during an input-enabled state and the operation-enabled state.

8. The frequency marker position setting method of a spectrum analyzer according to claim 7, further comprising:

a step of changing a position of the level marker on the vertical axis to a position of a signal level corresponding to the updated frequency in accordance with the change of the position of the frequency marker, and updating the value of the signal level indicated by the level indication frame to a value corresponding to the changed position of the signal level to display the updated value.

* * * * *